United States Patent
Jeong et al.

(10) Patent No.: US 12,543,386 B2
(45) Date of Patent: Feb. 3, 2026

(54) IMAGE SENSOR INCLUDING UNIT PIXELS

(71) Applicant: Samsung Electronics Co., Ltd., Suwon-si (KR)

(72) Inventors: Youjin Jeong, Suwon-si (KR); Minji Jung, Hwaseong-si (KR); Jeongjin Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1084 days.

(21) Appl. No.: 17/471,537

(22) Filed: Sep. 10, 2021

(65) Prior Publication Data
US 2022/0190023 A1 Jun. 16, 2022

(30) Foreign Application Priority Data
Dec. 16, 2020 (KR) .......... 10-2020-0176127

(51) Int. Cl.
H10F 39/00 (2025.01)
H10F 39/18 (2025.01)

(52) U.S. Cl.
CPC ......... *H10F 39/18* (2025.01); *H10F 39/8053* (2025.01); *H10F 39/8057* (2025.01); *H10F 39/8063* (2025.01); *H10F 39/807* (2025.01)

(58) Field of Classification Search
CPC ............ H10F 39/8027; H10F 39/8057; H10F 39/8063; H10F 39/807; H10F 39/18
See application file for complete search history.

(56) References Cited

U.S. PATENT DOCUMENTS

| | | |
|---|---|---|
| 8,466,998 B2 | 6/2013 | Suzuki |
| 9,172,892 B2 | 10/2015 | Dokoutchaev et al. |
| 9,224,776 B2 | 12/2015 | Okuzawa et al. |
| 9,661,306 B2 | 5/2017 | Hirota |
| 10,014,338 B2 | 7/2018 | Lee |

(Continued)

FOREIGN PATENT DOCUMENTS

| | | |
|---|---|---|
| KR | 20170098809 A | 8/2017 |
| KR | 20180040308 A | 4/2018 |
| KR | 20180133157 A | 12/2018 |

OTHER PUBLICATIONS

US 10,587,829, 6/2019, Yokogawa et al. (withdrawn)
Office Action for Korean Application No. 10-2020-0176127 dated Aug. 25, 2025.

*Primary Examiner* — Reema Patel
(74) *Attorney, Agent, or Firm* — Harness, Dickey & Pierce, P.L.C.

(57) ABSTRACT

An image sensor includes a substrate the substrate including a plurality of unit pixels arranged in a direction parallel to a first direction; a first and second photodiode inside of the substrate in each of the plurality of unit pixels and separated from each other in a second direction, perpendicular to the first direction; and a device isolation film between the plurality of unit pixels. A pair of pixels side-by-side in a third direction, perpendicular to the first and second direction, among the plurality of unit pixels, share a microlens, and at least one of the plurality of unit pixels includes a light shielding film on the substrate. Accordingly, in the image sensor, while maintaining the existing photodiode forming process, the autofocusing function in a vertical direction may be supplemented, and further, performance of the image sensor may be improved.

20 Claims, 35 Drawing Sheets

(56) References Cited

U.S. PATENT DOCUMENTS

| | | |
|---|---|---|
| 10,284,799 B2 * | 5/2019 | Yokogawa ........... H04N 25/134 |
| 10,594,970 B2 | 3/2020 | Sato et al. |
| 11,258,993 B2 | 2/2022 | Hoshino |
| 2018/0102389 A1 * | 4/2018 | Lee ....................... H10F 39/807 |
| 2020/0128172 A1 | 4/2020 | Nakata |
| 2020/0260054 A1 | 8/2020 | Masagaki |

* cited by examiner

IMAGE SENSOR INCLUDING UNIT PIXELS

CROSS-REFERENCE TO RELATED APPLICATION(S)

This application claims the benefit under 35 USC 119(a) of Korean Patent Application No. 10-2020-0176127 filed on Dec. 16, 2020 in the Korean Intellectual Property Office, the entire disclosure of which is incorporated herein by reference for all purposes.

BACKGROUND

The present inventive concepts relates to image sensors.

Image sensors are semiconductor-based sensors receiving light and generating electrical signals, and may include pixel arrays having a plurality of unit pixels, circuits for driving the pixel arrays and generating images. The image sensor may be applied to a digital image processing device such as a camera for capturing images or moving images, and it is necessary to detect a state of the focus adjustment of the imaging lens for autofocusing. Unlike the related art digital image processing apparatus that includes an element only for detecting focus separately from the image sensor, recently, an autofocusing image sensor using a method of detecting a phase difference has been developed. However, there is a problem in that the autofocusing performance in the vertical direction is relatively inferior compared to the autofocusing performance in the horizontal direction, and thus, improvement is desired.

SUMMARY

Example embodiments provide image sensors having improved performance, in which an autofocusing function is supplemented in a vertical direction, using image sensors including a microlens extending in the vertical direction and a light shielding film.

According to example embodiments, an image sensor includes a substrate including a first surface and a second surface opposing each other in a first direction, the substrate including a plurality of unit pixels arranged in a direction parallel to the first surface; a first photodiode and a second photodiode inside of the substrate in each of the plurality of unit pixels and separated from each other in a second direction, perpendicular to the first direction; and a device isolation film between the plurality of unit pixels. At least a pair of pixels side-by-side in a third direction, perpendicular to the first direction and the second direction, among the plurality of unit pixels, share a microlens, and at least one of the plurality of unit pixels includes a light shielding film above the substrate.

According to example embodiments, an image sensor includes a substrate including a first surface and a second surface opposing each other in a first direction, the substrate including a plurality of unit pixels arranged in a direction parallel to the first surface; a first photodiode and a second photodiode inside of the substrate in each of the plurality of unit pixels and separated from each other in a second direction, perpendicular to the first direction; and a device isolation film between the plurality of unit pixels. Among the plurality of unit pixels, at least a pair of pixels that are side-by-side in a third direction, perpendicular to the first direction and the second direction, share a plurality of microlenses side-by-side in the second direction, and each of the plurality of microlenses being on two first photodiodes or the second photodiodes.

According to example embodiments, an image sensor includes a pixel array including a plurality of pixel groups arranged in a direction parallel to an upper surface of a substrate, each of the plurality of pixel groups including at least one unit pixel; and a pixel circuit obtaining a pixel signal from unit pixels included in the plurality of pixel groups. The unit pixels are defined by a device isolation film extending in a first direction, perpendicular to an upper surface of the substrate, each of the unit pixels includes a first photodiode and a second photodiode spaced apart from each other in a second direction, perpendicular to the first direction, and a color filter on a first surface of the substrate, at least one of the plurality of pixel groups includes a plurality of shielding pixels including a plurality of light shielding films overlapping at least a portion of the first photodiode and the second photodiode in the first direction, and the plurality of shielding pixels include the color filter having a color different from a color of the color filter included in the unit pixels not including the light shielding film.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
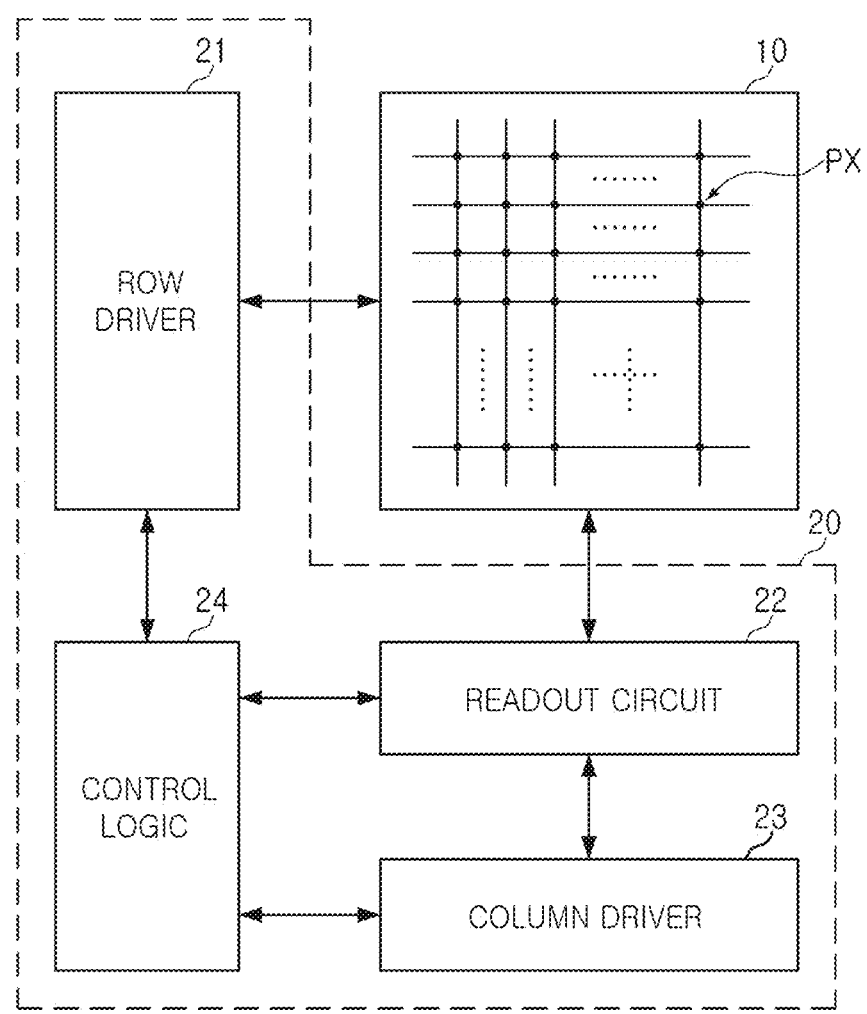
FIG. 1 is a block diagram schematically illustrating an image sensor according to some example embodiments.

FIG. 1 is a block diagram schematically illustrating an image sensor according to some example embodiments.

Referring to FIG. 1, an image sensor 1 according to some example embodiments may include a pixel array 10 and a logic circuit 20.

The pixel array 10 may include a plurality of unit pixels PX disposed in an array shape in a plurality of rows and a plurality of columns. Each of the unit pixels PX may include at least one photoelectric conversion element generating an electrical charge in response to light, a pixel circuit generating a pixel signal corresponding to the electrical charge generated by the photoelectric conversion element, and the like.

The photoelectric conversion device may include a photodiode formed of a semiconductor material, and/or an organic photodiode formed of an organic material. In some example embodiments, each of the unit pixels PX may include two or more photoelectric conversion elements, and two or more photoelectric conversion elements included in one unit pixel PX may receive light of different colors and thus receive electrical charges.

In some example embodiments, the unit pixels PX may each include a first photodiode and a second photodiode, and the first photodiode and the second photodiode receive light of different wavelength bands. Each may generate an electrical charge. However, this is only an example and the present example embodiments are not limited thereto.

In some example embodiments, the pixel circuit may include a transfer transistor, a driving transistor, a selection transistor, and a reset transistor. When each of the unit pixels PX has two or more photoelectric conversion elements, each of the unit pixels PX may include a pixel circuit for processing charges generated by each of the two or more photoelectric conversion elements. For example, each of the plurality of unit pixels PX included in the image sensor 1 according to some example embodiments may include two photodiodes. Accordingly, a pixel circuit corresponding to each of the unit pixels PX may include two or more of at least one of a transfer transistor, a driving transistor, a selection transistor, and a reset transistor. However, these are only some example embodiments, the present example embodiments are not limited thereto, and at least some of the photoelectric conversion elements may share some of the transistors.

The logic circuit 20 may include circuits for controlling the pixel array 10. For example, the logic circuit 20 may include a row driver 21, a readout circuit 22, a column driver 23, and a control logic 24.

The row driver 21 may drive the pixel array 10 in a row unit. For example, the row driver 21 may generate a transmission control signal for controlling a transfer transistor of a pixel circuit, a reset control signal for controlling the reset transistor, a selection control signal for controlling the selection transistor, and the like, and may input signals to the pixel array 10 in a row unit.

The readout circuit 22 may include a correlated double sampler (CDS), an analog-to-digital converter (ADC), or the like. The correlated double samplers may be connected to the unit pixels PX through column lines. The correlated double samplers may perform correlated double sampling by receiving a pixel signal from unit pixels PX connected to a row line selected by a row line selection signal of the row driver 21. The pixel signal may be received through the column lines. The analog-to-digital converter may convert the pixel signal detected by the correlated double sampler into a digital pixel signal and transmit the converted signal to the column driver 23.

The column driver 23 may include a latch or buffer circuit and an amplifying circuit for temporarily storing a digital pixel signal, and may process a digital pixel signal received from the readout circuit 22. The row driver 21, the readout circuit 22 and the column driver 23 may be controlled by the control logic 24. The control logic 24 may include a timing controller for controlling the operation timing of the row driver 21, the readout circuit 22, and the column driver 23.

Among the unit pixels PX, unit pixels PX disposed at the same position in the horizontal direction may share the same column line. For example, unit pixels PX arranged at the same position in the vertical direction are simultaneously selected by the row driver 21 and may output pixel signals through column lines. In some example embodiments, the readout circuit 22 may simultaneously obtain a pixel signal from the unit pixels PX selected by the row driver 21 through column lines. The pixel signal may include a reset voltage and a pixel voltage, and the pixel voltage may be a voltage in which charges generated in response to light in each of the unit pixels PX are reflected in the reset voltage. However, the description described with reference to FIG. 1 is not limited thereto, and the image sensor may additionally include other components and may be driven in various ways.

Figure 2:
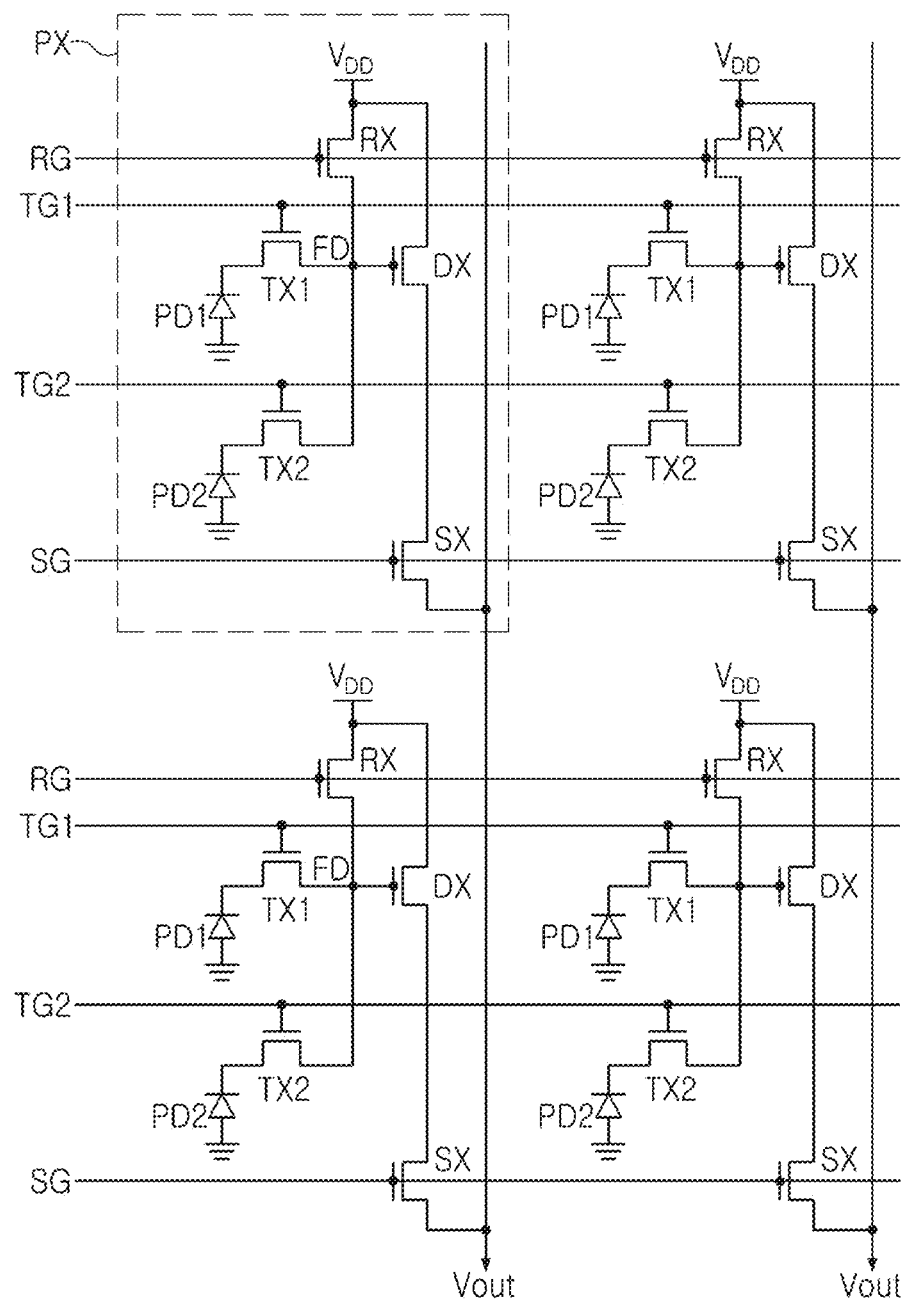
FIG. 2 is a circuit diagram of a pixel array included in an image sensor according to some example embodiments.

FIG. 2 is a circuit diagram of a pixel array included in an image sensor according to some example embodiments.

The image sensor 1 according to some example embodiments uses a first photodiode PD1 and a second photodiode PD2 separated from each other by an internal separation film based on the pixel circuit illustrated in FIG. 2. Thus, the autofocusing function may be provided. However, the pixel circuit of the unit pixel providing the autofocusing function is not necessarily limited to the one illustrated in FIG. 2, and some elements may be added or omitted as necessary.

As an example, each of the unit pixels PX may include the photodiode PD1, the photodiode PD2, a first pixel circuit that processes electrical charge generated by the first photodiode PD1, and a second pixel circuit that processes electrical charge generated by the second photodiode PD2. The first pixel circuit may include a plurality of first semiconductor devices, and the second pixel circuit may include a plurality of second semiconductor devices.

The first pixel circuit may include a first transfer transistor TX1, a reset transistor RX, a selection transistor SX, and a driving transistor DX. Meanwhile, the second pixel circuit may include a second transfer transistor TX2, a reset transistor RX, a selection transistor SX, and a driving transistor DX. As illustrated in FIG. 2, the first pixel circuit and the second pixel circuit may share a reset transistor RX, a selection transistor SX, and a driving transistor DX. However, these are only some example embodiments and the example embodiments are not limited to the example embodiments illustrated in FIG. 2, and the first and second pixel circuits may be designed in various ways. Meanwhile, the gate electrodes of the first and second transfer transistors TX1 and TX2, the reset transistor RX, and the selection transistor SX may be connected to the driving signal lines TG1, TG2, RG, and SG, respectively.

In some example embodiments, the first pixel circuit may generate a first electrical signal from the electrical charge generated by the first photodiode PD1 and may output the first electrical signal to the first column line, and the second pixel circuit may generate a second electrical signal from the electrical charge generated by the second photodiode PD2 and may output to the second column line. According to some example embodiments, two or more first pixel circuits disposed adjacent to each other may share one first column line. Similarly, two or more second pixel circuits disposed adjacent to each other may share one second column line. The second pixel circuits disposed adjacent to each other may share some of the second semiconductor devices.

The first transfer transistor TX1 is connected to the first transfer gate TG1 and the first photodiode PD1, and the second transfer transistor TX2 may be connected to the second transfer gate TG2 and the second photodiode PD2. Meanwhile, the first and second transmission transistors TX1 and TX2 may share the floating diffusion region FD. The first and second photodiodes PD1 and PD2 may generate and accumulate electrical charges in proportion to the amount of light incident from the outside. The first and second transfer transistors TX1 and TX2 may sequentially transfer charges accumulated in the first and second photodiodes PD1 and PD2 to the floating diffusion region FD. In order to transfer the charge generated by any one of the first and second photodiodes PD1 and PD2 to the floating diffusion region FD, signals complementary to each other may be applied to the first and second transfer gates TG1 and TG2. Accordingly, the floating diffusion region FD may accumulate charge generated by any one of the first and second photodiodes PD1 and PD2.

The reset transistor RX may periodically reset charges accumulated in the floating diffusion region FD. For example, electrodes of the reset transistor RX may be connected to the floating diffusion region FD and the power voltage VDD. When the reset transistor RX is turned on, charges accumulated in the floating diffusion region FD are discharged due to a potential difference with the power supply voltage VDD, and the floating diffusion region FD is reset, and the floating diffusion region FD The voltage of) may be the same as the power voltage VDD.

The operation of the driving transistor DX may be controlled according to the amount of charge accumulated in the floating diffusion region FD. The driving transistor DX may serve as a source follower buffer amplifier in combination with a current source disposed outside of the unit pixel PX. For example, a potential change due to the accumulation of electrical charges in the floating diffusion region FD may be amplified and output to the output line Vout.

The selection transistor SX may select unit pixels PX to be read in row units. When the selection transistor SX is turned on, an electrical signal output from the driving transistor DX may be transmitted to the selection transistor SX.

The logic circuit 20 may provide an autofocusing function using a first pixel signal obtained after the first transfer transistor TX1 is turned on and a second pixel signal obtained after the second transfer transistor TX2 is turned on.

Figure 3:
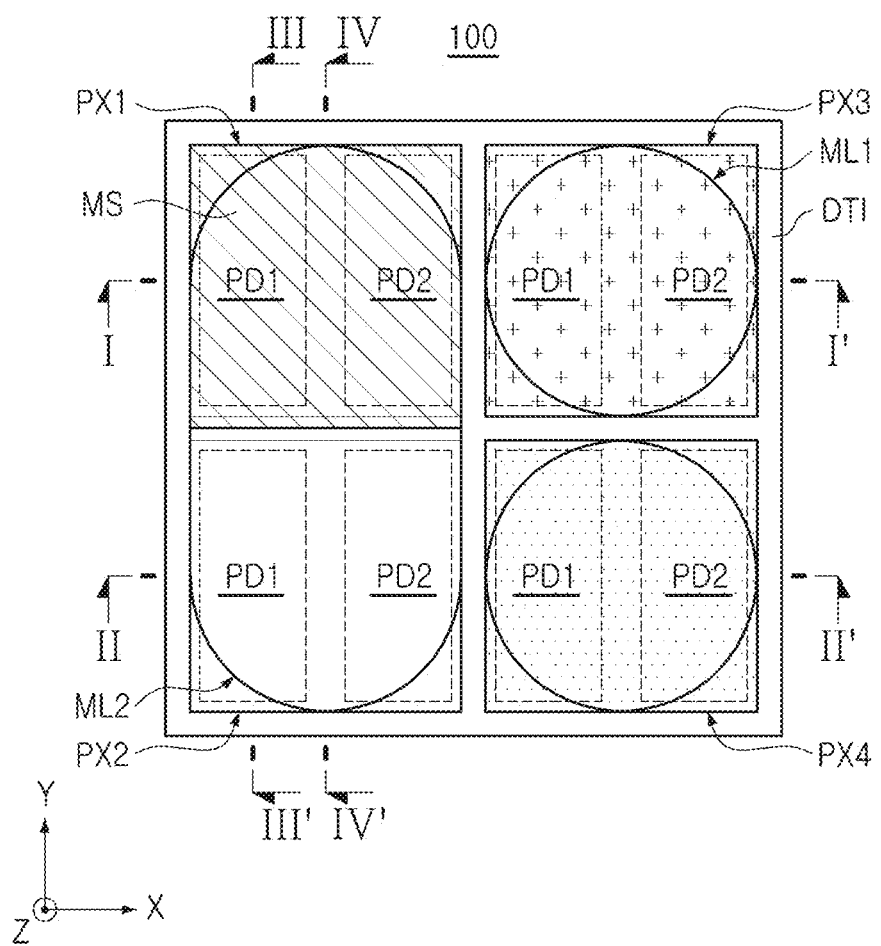
FIG. 3 is a top view of an image sensor according to some example embodiments.

FIG. 3 is a top view of an image sensor according to some example embodiments.

Referring to FIG. 3, an image sensor 100 according to some example embodiments may include first and second photodiodes PD1 and PD2, a device isolation film DTI disposed between a plurality of unit pixels PX1, PX2, PX3, and PX4, and microlenses ML1 and ML2. For example, the device isolation film DTI may separate the plurality of unit pixels PX1, PX2, PX3, and PX4 from each other and define a unit pixel. In each of the plurality of unit pixels PX1, PX2, PX3, and PX4, the first and second photodiodes PD1 and PD2, and the microlenses ML1 and ML2 may overlap in a first direction (e.g., z direction). The microlenses ML1 and ML2 are disposed at the uppermost of each of the plurality of unit pixels PX1, PX2, PX3, and PX4 in the first direction to allow external light to be incident. The first and second photodiodes PD1 and PD2 may be separated from each other in a second direction (e.g., an x direction) perpendicular to the first direction. Meanwhile, although not illustrated in FIG. 3, the image sensor 100 may further include an internal device isolation film defining the first and second photodiodes PD1 and PD2, between the first and second photodiodes PD1 and PD2.

In general, an image sensor in which one unit pixel includes two photodiodes may detect a phase difference of two light divided by dividing external light incident through a microlens into photodiodes disposed at a distance by the same distance and entering the image sensor. For example, the phase difference between the two lights may correspond to the phase difference in the horizontal direction. Meanwhile, the image sensor may perform an autofocusing operation by moving the microlens based on the detection result. Considering the structure of the image sensor related to the arrangement of photodiodes, the ability to detect the phase difference of light in the vertical direction may be lower than the ability to detect the phase difference of light in the horizontal direction. In detail, autofocusing performance in the vertical direction of the image sensor may be a problem.

The image sensor 100 according to some example embodiments may include a second microlens ML2 having a shape deformed (e.g., different) from the first microlens ML1 and/or a light shielding film MS in order to solve the above problem. For example, the microlenses ML1 and ML2 may include a first microlens ML1 corresponding to one unit pixel, and a second microlens ML2 having a shape different from that of the first microlens ML1. However, the shape of the second microlens ML2 is not limited to the example embodiments illustrated in FIG. 3. Alternatively or additionally, the image sensor 100 may include a light shielding film MS that blocks a portion of light in a vertical direction, for example, a third direction (e.g., a y direction) perpendicular to the first direction and the second direction. For example, the light shielding film MS may be a metal shielding layer including tungsten (W) and/or the like. For example, the light shielding film MS may detect a phase difference of light divided in the vertical direction by blocking a portion of incident light. Accordingly, the image sensor 100 may improve autofocusing performance in the vertical direction by using the detected phase difference. However, the shape of the light shielding film MS is not limited to the example embodiments illustrated in FIG. 3. The image sensor 100 including the second microlens ML2 and/or the light shielding film MS described above may detect the phase difference of light in the vertical direction, thereby preventing or reducing the problem of autofocusing performance in the vertical direction, for example, the third direction, while maintaining the autofocusing performance in the horizontal direction, for example, the second direction.

As an example, the image sensor 100 according to some example embodiments illustrated in FIG. 3 may include both the second microlens ML2 and the light shielding film MS. Meanwhile, the light shielding film MS included in the image sensor 100 may overlap a portion of the second microlens ML2 in the first direction. However, the configuration of the image sensor 100 illustrated in FIG. 3 is only an example embodiment and the present example embodiments are not limited thereto. For example, the image sensors according to example embodiments may include the second microlens ML2 and may not include the light shielding film MS. Alternatively or additionally, the image sensor may include only the first microlens ML1 and may include a light shielding film MS. For example, the image sensor may include a second microlens ML2 and a light shielding film MS that does not overlap with the second microlens ML2 in the first direction.

In the image sensor 100 according to some example embodiments, a first pixel PX1 and a second pixel PX2 among a plurality of unit pixels PX1, PX2, PX3, and PX4 may correspond to one second microlens ML2. In detail, the first pixel PX1 and the second pixel PX2 may share the second microlens ML2. For example, the first pixel PX1 and the second pixel PX2 may be unit pixels that are disposed side-by-side in the third direction. Meanwhile, each of the third and fourth pixels PX3 and PX4 may correspond to one first microlens ML1.

In the image sensor 100 according to some example embodiments, at least one of the plurality of unit pixels PX1, PX2, PX3, PX4 may include a light shielding film MS for improving the autofocusing function in the vertical direction. For example, at least one unit pixel including the light shielding film MS may include one of a first pixel PX1 and a second pixel PX2 including the modified second microlens ML2. For example, in the image sensor 100 illustrated in FIG. 3, the first pixel PX1 may include a light shielding film MS. In this case, in a plane perpendicular to the first direction, the area of the light shielding film MS may correspond to the area of the first pixel PX1.

In the image sensor 100 according to some example embodiments, a first pixel PX1 including a light shielding film MS, and a second pixel PX2 sharing a second microlens ML2 with the first pixel PX1 may include a color filter having the same color. For example, a color filter included in the first pixel PX1 and the second pixel PX2 may be white. However, this is only one example of the example embodiments and the present example embodiments are not limited thereto, and the color filter may be any one of green, red, and blue, or may have other colors.

FIGS. 4 to 7 are cross-sectional views of an image sensor according to some example embodiments illustrated in FIG. 3.

FIGS. 4 to 7 may be cross-sectional views of the image sensor 100 illustrated in FIG. 3 taken along any one of lines I-I' to IV-IV', respectively. As an example, FIG. 4 may be a cross-sectional view illustrating a cross-section in the direction I-I' of FIG. 3, and FIG. 5 may be a cross-sectional view illustrating a cross-section along the line II-II' of FIG. Alternatively or additionally, FIG. 6 may be a cross-sectional view illustrating a cross-section in the direction III-III' of FIG. 3, and FIG. 7 may be a cross-sectional view illustrating a cross-section in the direction IV-IV' of FIG. 3.

Referring to FIGS. 4 to 7, the image sensor 100 according to some example embodiments may include a substrate 110 including a first surface 111 and a second surface 112 opposing each other, and a device isolation film DTI disposed between the plurality of unit pixels PX1, PX2, PX3, and PX4 within the substrate 110. For example, the plurality of unit pixels PX1, PX2, PX3, and PX4 may be arranged in a direction parallel to the first surface 111. Meanwhile, each of the plurality of unit pixels PX1, PX2, PX3, and PX4 may include first and second photodiodes PD1 and PD2 disposed inside of the substrate 110 and separated from each other in a second direction (e.g., an X direction).

Although not illustrated in the cross-sectional views of FIGS. 4 to 7, an internal device isolation film may be further included between the first and second photodiodes PD1 and PD2. For example, the device isolation film DTI and the internal device isolation film may extend in a first direction (e.g., a z direction) within the substrate 110 including a semiconductor material. The device isolation film DTI and the internal device isolation film may extend from the second surface 112 toward the first surface 111. However, the present disclosure is not limited thereto, and may extend from the first surface 111 toward the second surface 112 according to the process. Meanwhile, when the device isolation film DTI and the internal device isolation film extend from the first surface 111 toward the second surface 112, the internal device isolation film is connected to the first surface 111 and the second surface 112 May not be connected to. For example, the length of the internal device isolation film in the first direction may be shorter than the device isolation film DTI. However, the present disclosure is not limited thereto, and the internal device isolation film may have the same length as the device isolation film DTI in the first direction.

In the image sensor 100 according to some example embodiments, each of the plurality of unit pixels PX1, PX2, PX3, and PX4 may include a color filter 121, 122, 123, 124 disposed on the first surface 111 of the substrate 110, a light transmitting layer 130, and microlenses ML1 and ML2. For example, a light shielding film MS may be disposed on the first color filter 121 included in the first pixel PX1. However, this is only one example of the example embodiments, the present example embodiments are not limited thereto, and the arrangement of the light shielding film MS may vary according to example embodiments.

Some of the plurality of unit pixels PX1, PX2, PX3, and PX4 may each include one first microlens ML1 disposed above the first photodiode PD1 and the second photodiode PD2. For example, the third pixel and the fourth pixel may each include one first microlens ML1. Meanwhile, others of the plurality of unit pixels PX1, PX2, PX3, and PX4 may include a second microlens ML2 disposed above the first photodiode PD1 and the second photodiode PD2. For example, the first pixel and the second pixel may share one second microlens ML2. Light passing through the microlenses ML1 and ML2 may be incident on the first photodiode PD1 and the second photodiode PD2 together. As described above, the image sensor 100 according to some example embodiments may supplement the autofocusing function in the vertical direction by using the modified second microlens ML2 and/or the light shielding film MS.

In the image sensor 100 according to some example embodiments, a pixel circuit may be disposed below the first photodiode PD1 and the second photodiode PD2. As an example, the pixel circuit may include a plurality of elements 160, wiring patterns 170 connected to the plurality of elements 160, an insulating layer 180 covering the plurality of elements 160 and the wiring patterns 170, and the like, and may be disposed on the second surface 112 of the substrate 110.

The pixel circuit may include a floating diffusion region 150. As an example, each of the plurality of unit pixels PX1, PX2, PX3, and PX4 may include a floating diffusion region 150 disposed below at least one of the first photodiode PD1 and the second photodiode PD2. As an example, each of the floating diffusion regions 150 may be electrically connected to each other by at least one of the wiring patterns 170, and the location and area of each of the floating diffusion regions 150 may vary according to example embodiments. For example, the plurality of devices 160 adjacent to the floating diffusion region 150 may be a first transfer transistor and a second transfer transistor. The gates of each of the first and second transfer transistors may have a vertical structure in which at least some regions are buried in the substrate 110.

Figure 4:
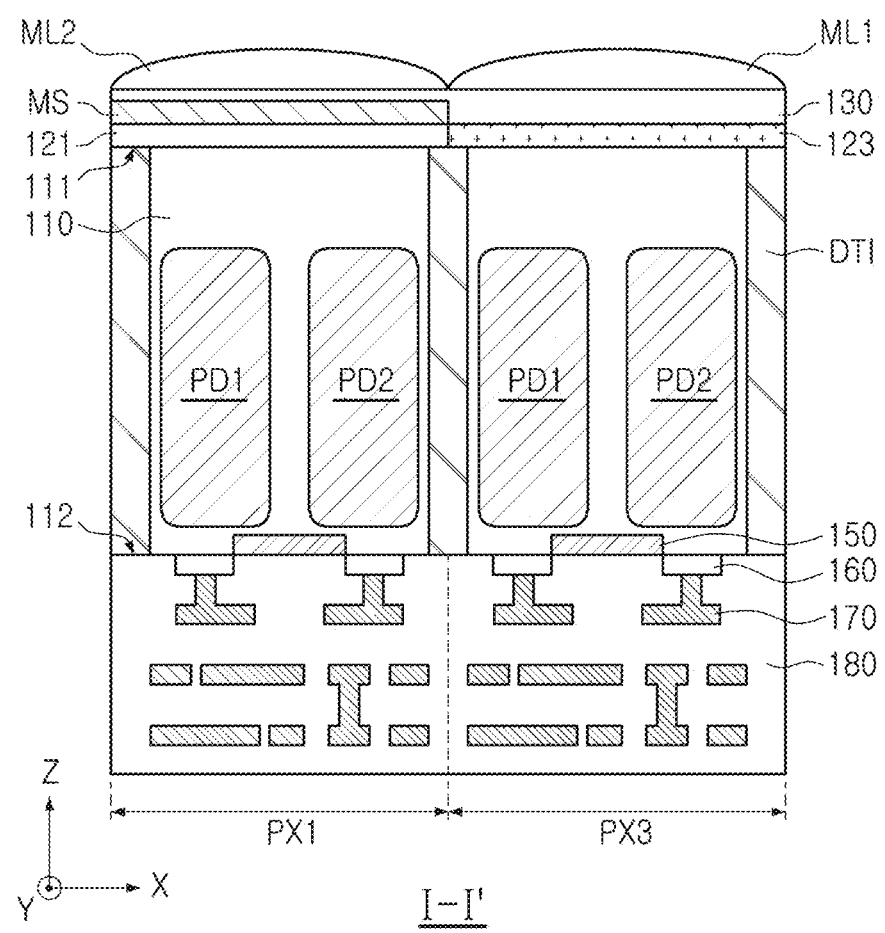
FIGS. 4 to 7 are cross-sectional views of an image sensor according to some example embodiments illustrated in FIG. 3.

Referring to FIG. 4, a first pixel PX1 among a plurality of unit pixels PX1, PX2, PX3, and PX4 included in the image sensor 100 may be a pixel for supplementing the autofocusing function in the vertical direction, The third pixel PX3 may be a general pixel or an autofocusing pixel related to an autofocusing function in the horizontal direction. For example, the first pixel PX1 may include a second microlens ML2 extending in a third direction (e.g., a y direction). Alternatively or additionally, the first pixel PX1 may include the light shielding film MS, and may be defined as a shielding pixel.

Figure 5:
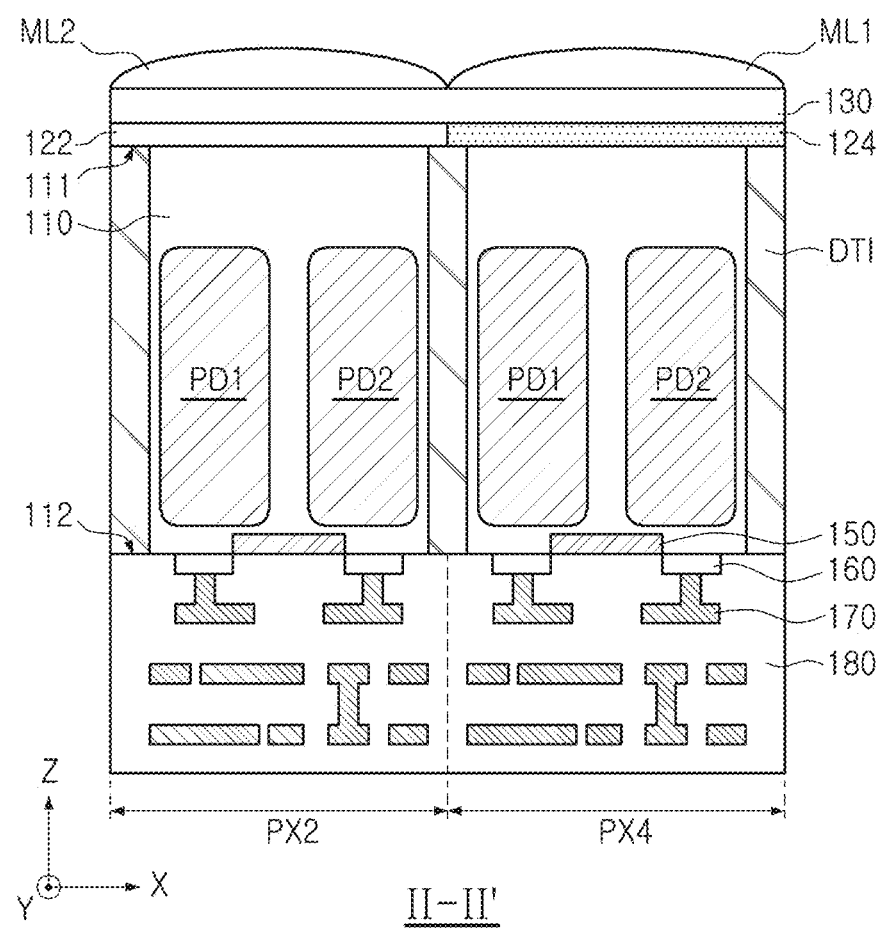
Figure 6:
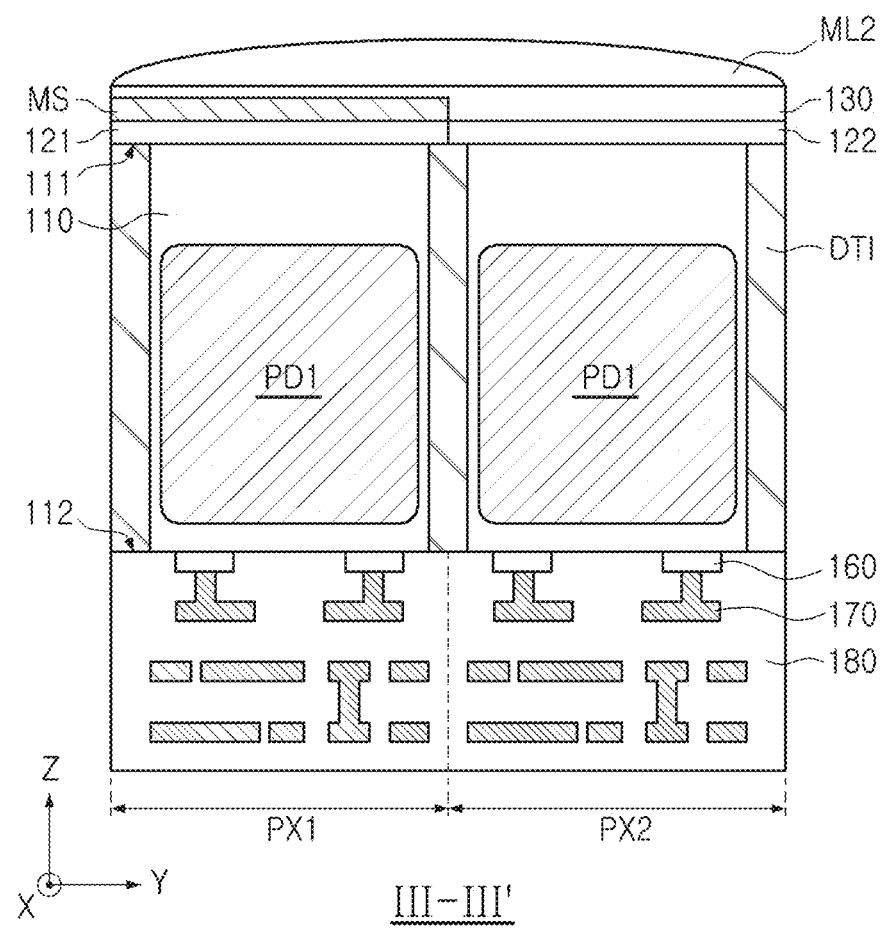

Referring to FIGS. 5 and 6, a second pixel PX2 among a plurality of unit pixels PX1, PX2, PX3, and PX4 included in the image sensor 100 may be a pixel used to supplement the autofocusing function in the vertical direction, and the fourth pixel PX4 may be a general pixel, or an autofocusing pixel related to an autofocusing function in the horizontal direction. For example, the second pixel PX2 may include the second microlens ML2 extending in the third direction and may not include the light shielding film MS unlike the first pixel PX1. For example, the second pixel PX2 may improve the autofocusing function in the vertical direction of the image sensor 100 together with the first pixel PX1.

Figure 7:
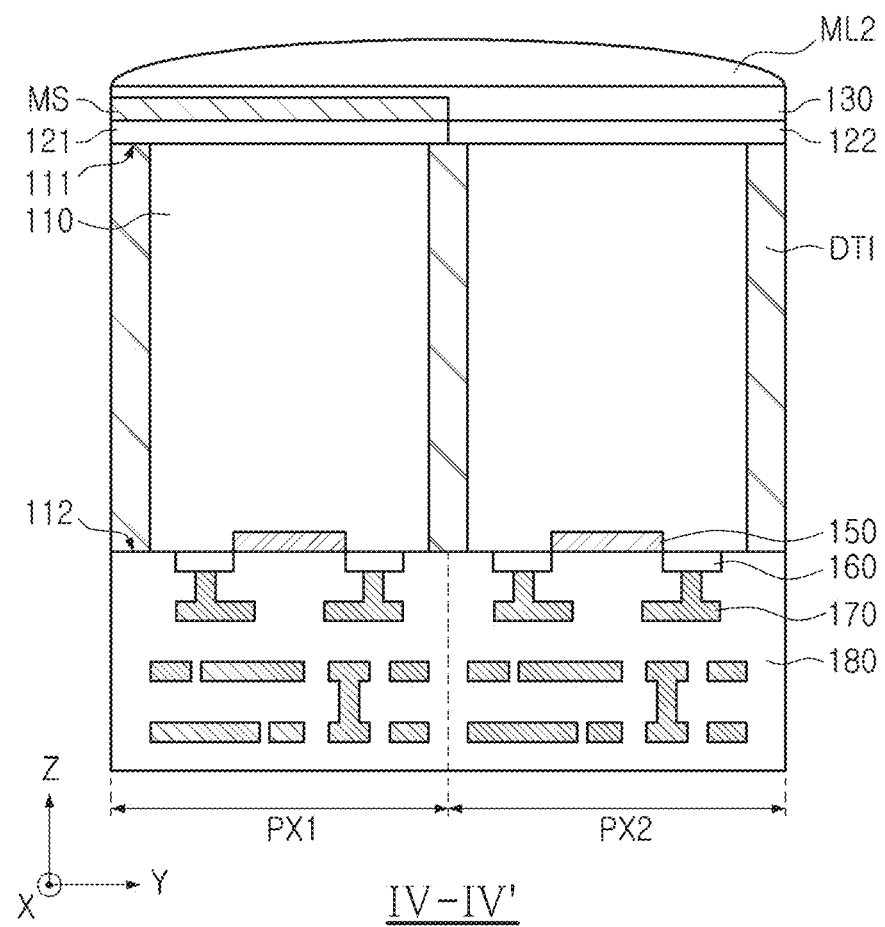

Referring to FIG. 7, the image sensor 100 may include a first photodiode PD1 and a second photodiode PD2 separated from each other. For example, in the third direction, the image sensor 100 may have at least one cross section that does not include the first photodiode PD1 and the second photodiode PD2.

However, the cross-sectional view of the image sensor 100 illustrated in FIGS. 4 to 7 are only some example embodiments and the example embodiments are not limited thereto. For example, the cross-sectional view of the image sensor 100 may be changed depending on the shape of the second microlens ML2, the light shielding film MS, the device isolation film DTI, and the internal device isolation film, and the arrangement relationship between respective components and the color filters 121, 122, 123 and 124.

Figure 8:
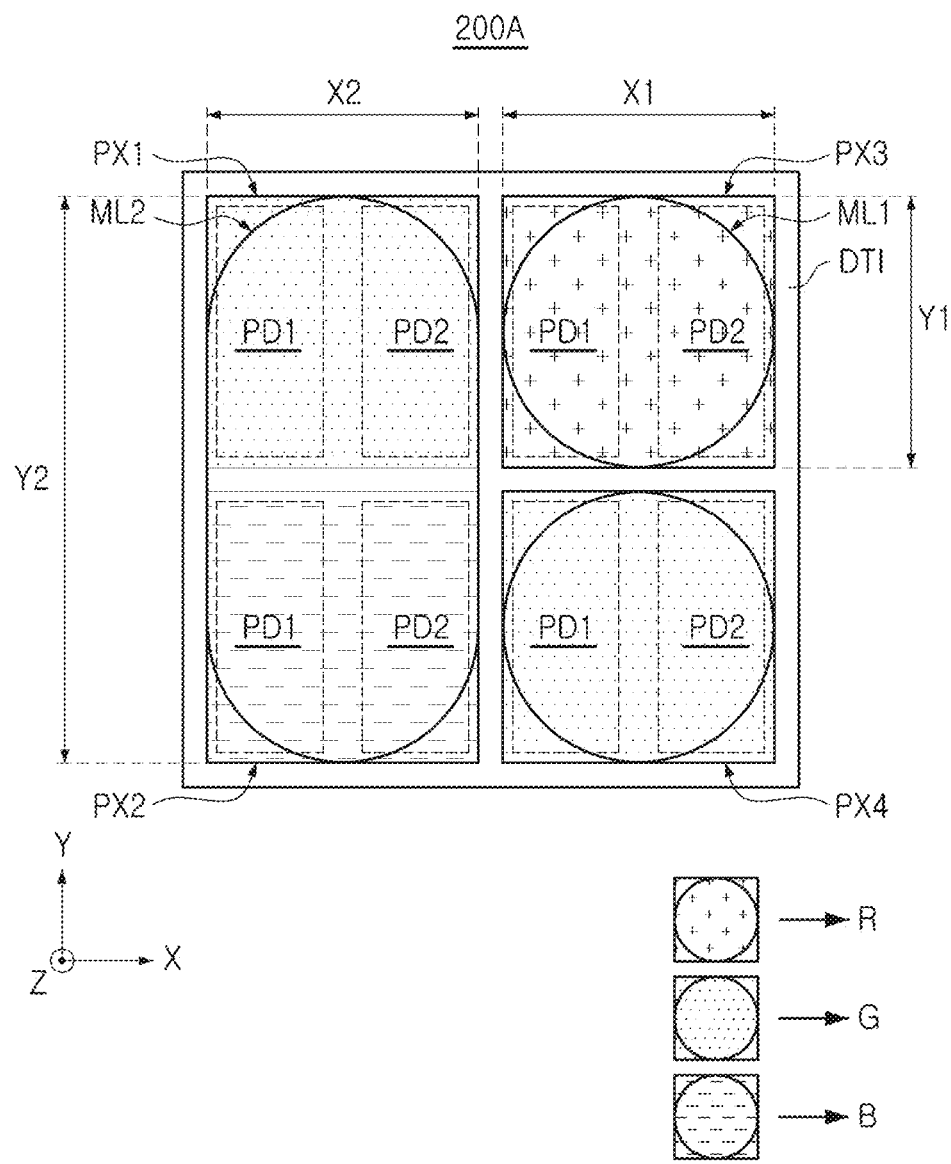
FIGS. 8 and 9 are top views of an image sensor according to example embodiments.
Figure 9:
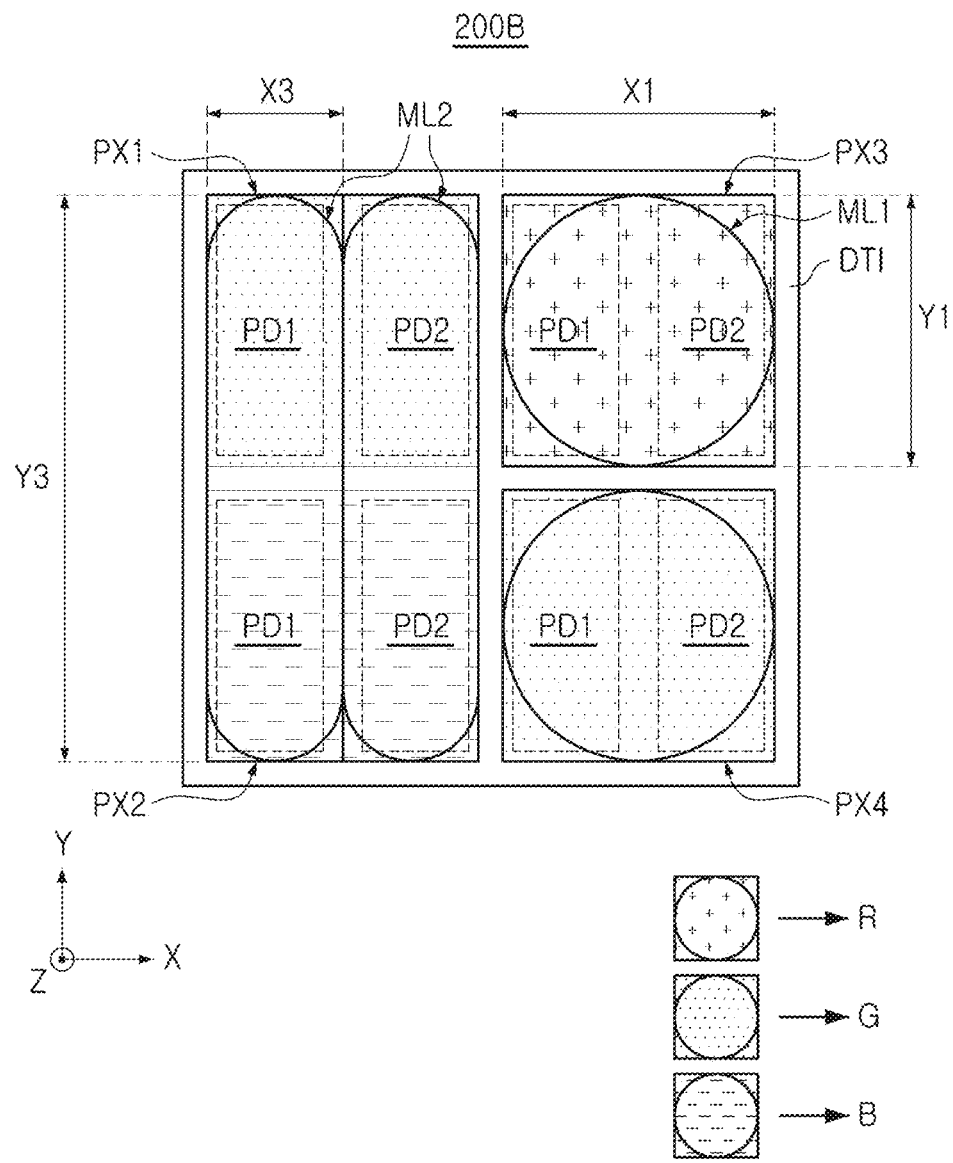

FIGS. 8 and 9 are top views of an image sensor according to example embodiments.

Referring to FIGS. 8 and 9, image sensors 200A and 200B according to example embodiments may include first and second photodiodes PD1 and PD2 separated in a second direction (e.g., x direction) inside a semiconductor substrate, a device isolation film DTI disposed between the plurality of unit pixels PX1, PX2, PX3, and PX4, and microlenses ML1 and ML2. As an example, the image sensors 200A and 200B may be image sensors in which the light shielding film MS is removed and the color filters 121, 122, 123, and 124 are changed from the image sensor 100 illustrated in FIG. 3. Other components may correspond to the image sensor 100. However, this is only an example and the present example embodiments are not limited thereto. As an example, the image sensors 200A and 200B may further include a light shielding film MS according to some example embodiments.

Meanwhile, a second microlens ML2 may be disposed above the first pixel PX1 and the second pixel PX2 among the plurality of unit pixels PX1, PX2, PX3, and PX4 included in the image sensors 200A and 200B. A first microlens ML1 may be disposed above the third pixel PX3 and the fourth pixel PX4. As an example, the first pixel PX1 and the second pixel PX2 may be disposed side-by-side in a third direction (e.g., y direction). The second microlens ML2 may have a shape in which the first microlens ML1 is deformed (e.g., different). As an example, the first microlens ML1 may be a microlens corresponding to each of the third pixel PX3 and the fourth pixel PX4, and the first pixel PX1 and the second pixel PX2 may share at least one second microlens ML2.

Referring to FIG. 8, in the image sensor 200A according to some example embodiments, a first pixel PX1 and a second pixel PX2 may share one second microlens ML2. As an example, since each of the plurality of unit pixels PX1, PX2, PX3, and PX4 may include first and second photodiodes PD1 and PD2, one second microlens ML2 may be disposed above the two first photodiodes PD1 and the two second photodiodes PD2, in the first pixel PX1 and the second pixel PX2.

In the image sensor 200A according to some example embodiments, a first pixel PX1 and a second pixel PX2 disposed side-by-side in a third direction (e.g., y direction) may share a second microlens ML2, and may be used to complement the autofocusing performance in the vertical direction, for example, the third direction. As an example, the image sensor 200A may detect a phase difference in the horizontal direction of light incident through the second microlens ML2 corresponding to the first photodiode PD1 and the second photodiode PD2 included in one unit pixel. Meanwhile, the first photodiode PD1 of each of the first and second pixels PX1 and PX2 may be separated in a third direction, and the second photodiode PD2 may be separated in a third direction, likewise. As an example, the image sensor 200A may detect a phase difference in the vertical direction of light incident through the second microlens ML2 corresponding to two first photodiodes PD1 and/or two second photodiodes PD2 disposed in the vertical direction.

In the image sensor 200A illustrated in FIG. 8, the first microlens ML1 may have a length of X1 in the second direction and a length of Y1 in the third direction. Meanwhile, the second microlens ML2 may have a length of X2 in the second direction and a length of Y2 in the third direction. For example, since the first pixel PX1 and the second pixel PX2 share one second microlens ML2, the second microlens ML2 and the first microlens ML1 in the second direction may have the same length. Alternatively or additionally, the second microlens ML2 may have a length greater than that of the first microlens ML1 in the third direction. In detail, X1 may be substantially (e.g., about) the same as X2, and Y1 may be smaller than Y2. For example, Y2 may be greater than or equal to twice (or more) Y1.

Referring to FIG. 9, in the image sensor 200B according to some example embodiments, a first pixel PX1 and a second pixel PX2 may share two second microlenses ML2. As an example, since each of the plurality of unit pixels PX1, PX2, PX3, and PX4 may include first and second photodiodes PD1 and PD2, each of the second microlenses ML2 has a first pixel PX1. The second pixel PX2 may be disposed above the two first photodiodes PD1 or the two second photodiodes PD2.

In the image sensor 200B illustrated in FIG. 9, the first microlens ML1 may have a length of X1 in the second direction and a length of Y1 in the third direction. Meanwhile, each of the second microlenses ML2 may have a length of X3 in the second direction and a length of Y3 in the third direction. For example, since the first pixel PX1 and the second pixel PX2 share two second microlenses ML2, the second microlens ML2 may have a length shorter than the first microlens ML1 in the second direction. Alternatively or additionally, the second microlens ML2 may have a length greater than that of the first microlens ML1 in the third direction. In detail, X1 may be a value larger than X2, and Y1 may be a value smaller than Y2. For example, X1 may be greater than or equal to twice (or more) as much as X2, and Y2 may be greater than or equal to twice (or more) as large as Y1.

The operation of the image sensor 200B according to some example embodiments may be similar to that of the image sensor 200A illustrated in FIG. 8. For example, light incident on each of the second microlenses ML2 may be incident on two first photodiodes PD1 or two second photodiodes PD2. Accordingly, the image sensor 200B may improve autofocusing performance in the vertical direction, for example, the third direction. However, the first pixel PX1 and the second pixel PX2 included in the image sensor 200B illustrated in FIG. 9 may have relatively poor autofocusing performance in the horizontal direction, for example, the second direction.

In the image sensors 200A and 200B, according to example embodiments for improving the autofocusing performance in the vertical direction, the modified second microlens ML2 is used without a light shielding film, and the modified shape of the second microlens ML2 is not limited to FIGS. 8 and 9 and may vary according to example embodiments. Meanwhile, in the image sensors 200A and 200B illustrated in FIGS. 8 and 9, the color filters included in the first pixel PX1 and the second pixel PX2 are illustrated as having different colors, but are not limited thereto. For example, since the phase difference of incident light may vary depending on the color of the color filter, the color filters included in the first pixel PX1 and the second pixel PX2, including the second microlens ML2, may have the same color. For example, a color filter included in the first pixel PX1 and the second pixel PX2 may be green. However, the example embodiments are not limited thereto, and may be red, blue, or other colors.

Figure 10:
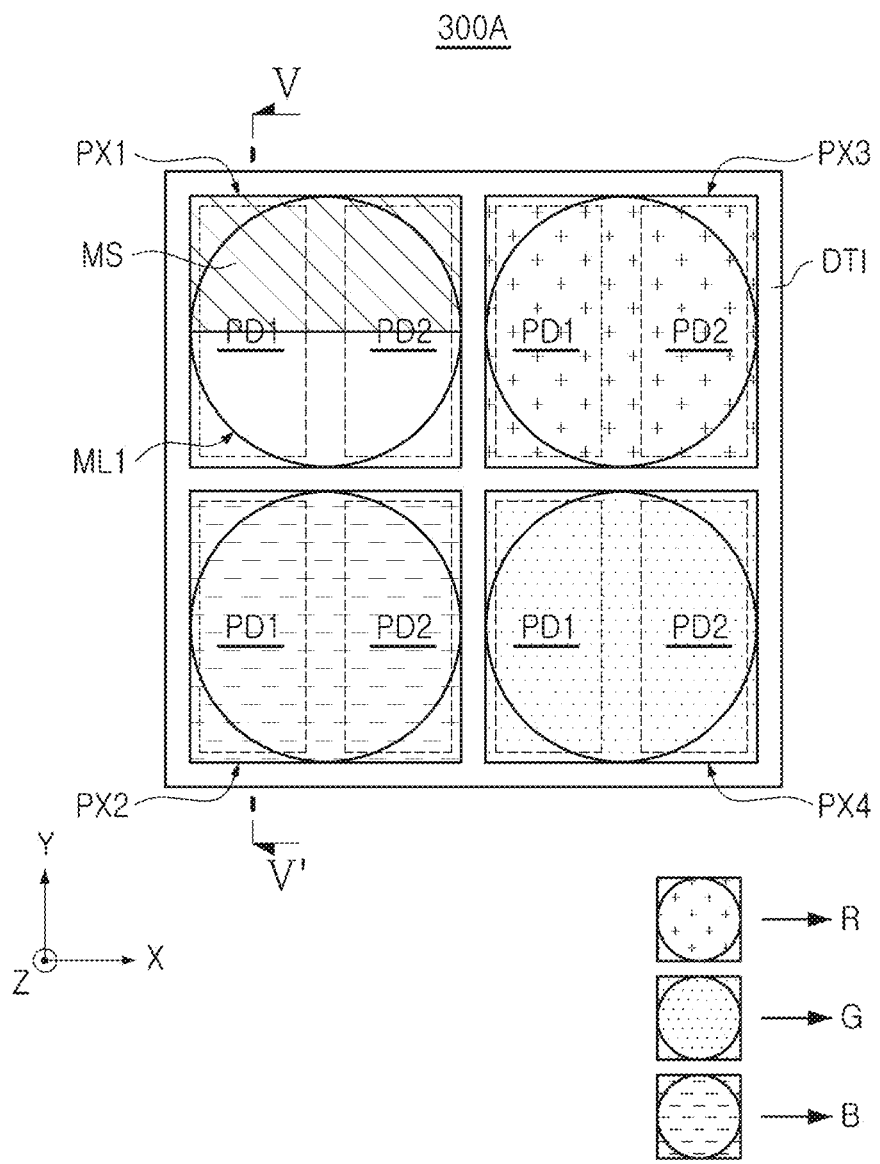
FIG. 10 is a top view of an image sensor according to some example embodiments.

FIG. 10 is a top view of an image sensor according to some example embodiments.

Referring to FIG. 10, the image sensor 300A according to some example embodiments may include first and second photodiodes PD1 and PD2 separated in a second direction (e.g., x direction) inside a semiconductor substrate. A device isolation film DTI, a first microlens ML1, and a light shielding film MS may be disposed between the plurality of unit pixels PX1, PX2, PX3, and PX4. As an example, the image sensor 300A may be an image sensor including a first microlens ML1 corresponding to each of the first pixel PX1 and the second pixel PX2, instead of the second microlens ML2 in the image sensor 100 illustrated in FIG. 3. Other components may correspond to the components included in image sensor 100. However, this is only an example and the present example embodiments are not limited thereto. As an example, the image sensor 300A may have a different arrangement of the light shielding film MS or may further include a second microlens ML2 according to some example embodiments.

Among the plurality of unit pixels PX1, PX2, PX3, and PX4 included in the image sensor 300A according to some example embodiments, the first pixel PX1 may include a light shielding film MS for blocking a portion of incident light. For example, the light shielding film MS included in the image sensor 300A may overlap a portion of the first microlens ML1 in the first direction. However, the shape of the light shielding film MS is not limited to the example embodiments illustrated in FIG. 10. The image sensor 300A including the light shielding film MS may prevent or reduce the problem of autofocusing performance in vertical direction, for example, the third direction by detecting the phase difference of light in the vertical direction, while maintaining the autofocusing performance in the horizontal direction, for example, the second direction.

In the image sensor 300A according to some example embodiments, at least one of the plurality of unit pixels PX1, PX2, PX3, PX4 may include a light shielding film MS for improving the autofocusing function in the vertical direction. For example, the first pixel PX1 included in the image sensor 300A may include a light shielding film MS. In this case, the first pixel PX1 may be defined as a shielding pixel. In the shielding pixel, the light shielding film MS may have a boundary surface overlapping the optical axis of the microlens disposed thereon. In detail, the first pixel PX1 of the image sensor 300A illustrated in FIG. 10 may be a shielding pixel including the light shielding film MS. For example, the first pixel PX1 may include the first microlens ML1, and the optical axis of the first microlens ML1 may be an axis passing through the center of the first pixel PX1. Meanwhile, the boundary surface of the light shielding film MS may pass through the optical axis of the first microlens ML1. For example, the light shielding film MS may have an boundary surface that passes through the optical axis of the first microlens ML1 and is positioned on a plane perpendicular to the third direction. In detail, in a plane perpendicular to the first direction, the area of the light shielding film MS may correspond to half (or about half) of the area of the first pixel PX1.

In the image sensor 300A according to some example embodiments, the first pixel PX1 including the light shielding film MS may include a color filter of a different color from that of other unit pixels PX2, PX3, and PX4 that do not include the light shielding film MS. For example, the color filter included in the first pixel PX1 may be white. However, this is only one example of the example embodiments and the present example embodiments are not limited thereto, and the color filter included in the first pixel PX1 may be any one of green, red, and blue, or may be another color.

Figure 11:
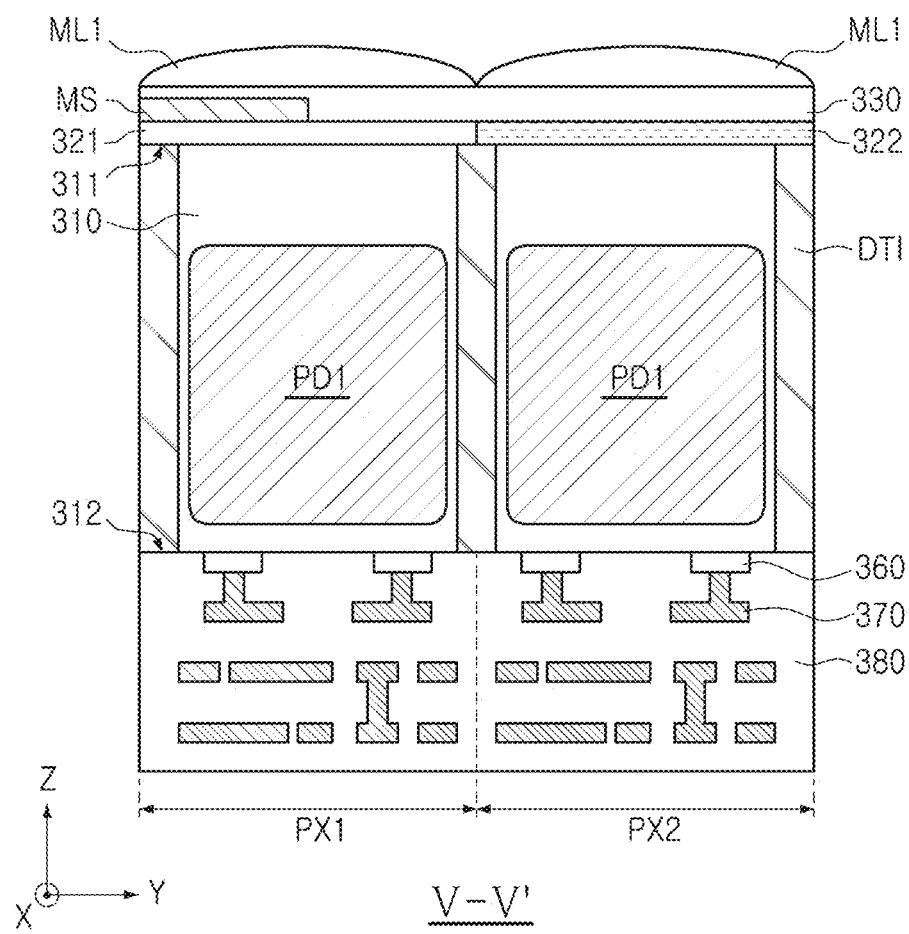
FIG. 11 is a cross-sectional view of an image sensor according to some example embodiments illustrated in FIG. 10.

FIG. 11 is a cross-sectional view of an image sensor according to some example embodiments illustrated in FIG. 10.

FIG. 11 may be a cross-sectional view of the image sensor 300A illustrated in FIG. 10 taken along a line V-V'. The image sensor 300A illustrated in FIG. 11 may correspond to a cross-sectional view of the image sensor 100 illustrated in FIG. 6. As an example, the sensor 300A according to some example embodiments may include a substrate 310 including a first surface 311 and a second surface 312 facing each other, and a device isolation film disposed between the unit pixels PX1, PX2, PX3, and PX4 in the substrate 310. Meanwhile, each of the plurality of unit pixels PX1, PX2, PX3, and PX4 may include first and second photodiodes PD1 and PD2 disposed inside of the substrate 310 and separated from each other in a second direction (e.g., x direction).

However, the image sensor 300A may include a configuration different from the color filters 121, 122, 123, 124, the light shielding film MS, and the second microlens ML2 included in the image sensor 100 illustrated in FIG. 6. For example, the image sensor 300A may include two first microlenses ML1 instead of the second microlenses ML2, and alternatively or additionally, may include a light shielding film MS corresponding to half (or about half) of the first pixel PX1, and the color filter 322 included in the second pixel PX2 may have a color different from that of the color filter 321 included in the first pixel PX1. For example, the color filter 322 included in the second pixel PX2 may be blue, and the color filter 321 included in the first pixel PX1 may be white. However, this is only an example and the present example embodiments are not limited thereto. As an example, this may be explained from a top view of the image sensors 100 and 300A illustrated in FIGS. 3 and 10, respectively. However, the present disclosure is not limited thereto, and the arrangement and shape of the light shielding film MS may vary according to example embodiments.

Figure 12:
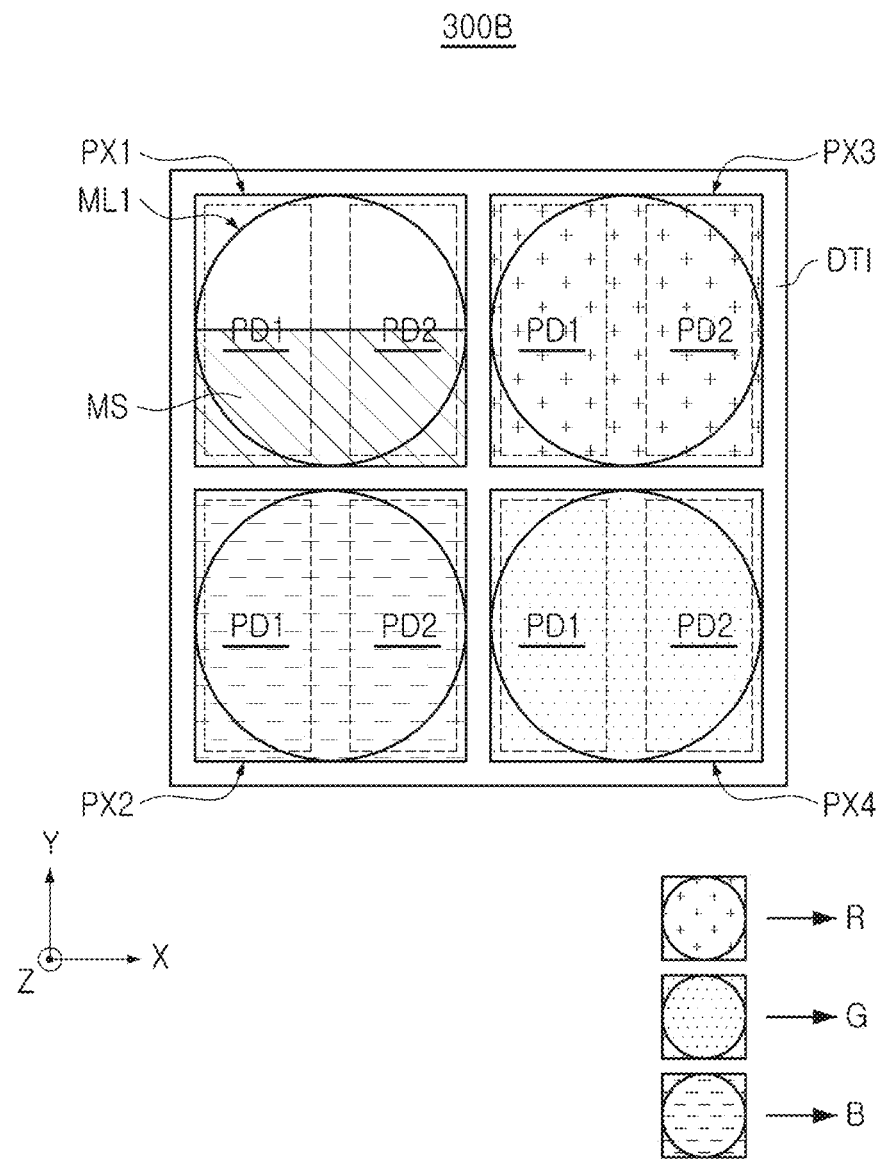
FIGS. 12 to 14 are top views of an image sensor according to example embodiments.
Figure 13:
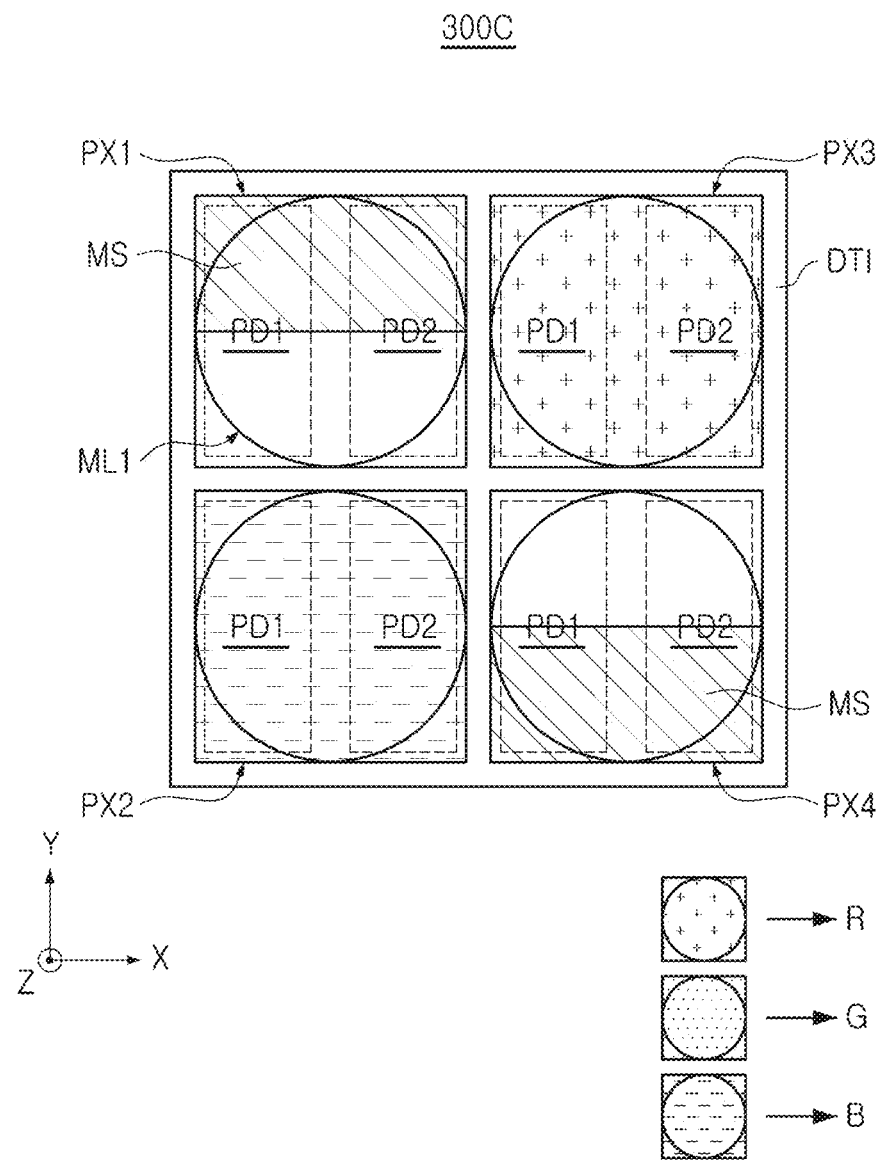
Figure 14:
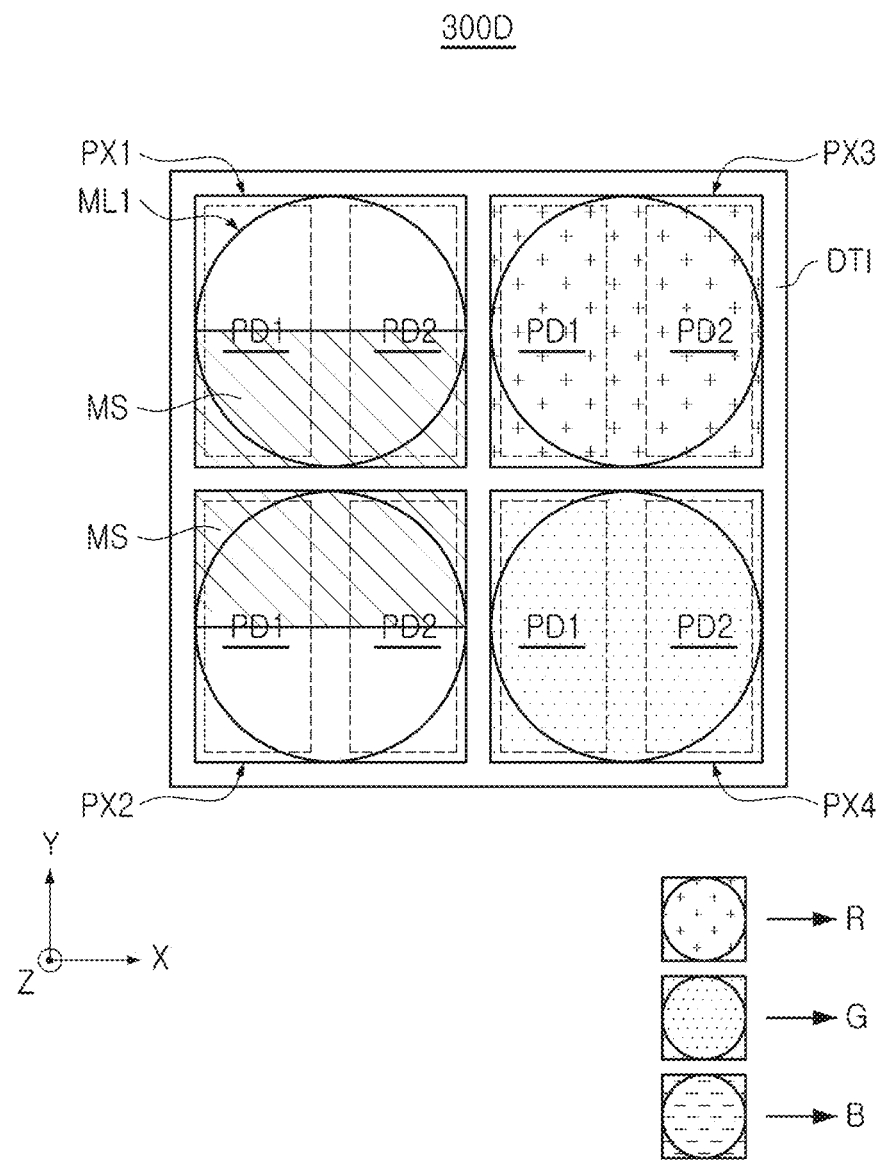

FIGS. 12 to 14 are top views of an image sensor according to example embodiments.

The image sensors 300B, 300C, and 300D illustrated in FIGS. 12 to 13 may be embodiments corresponding to the image sensor 300A illustrated in FIG. 10. For example, the image sensors 300B, 300C, and 300D may include a first microlens ML1 having the same size, and a light shielding film MS overlapping the first microlens ML1 in a first direction (e.g., z direction). However, the arrangement and number of the light shielding films MS may vary according to example embodiments. Meanwhile, shielding pixels including the light shielding film MS may include color filters of the same color. As an example, the shielding pixels may include a white color filter. However, this is only an example and the present example embodiments are not limited thereto.

For example, referring to FIGS. 12 to 14, the first pixel PX1 included in each of the image sensors 300B, 300C, and 300D may be a shielding pixel including a light shielding film MS. The light shielding film MS may have a boundary surface overlapping the optical axis of the first microlens ML1 disposed thereon. For example, the first pixel PX1 may include the first microlens ML1, and the optical axis of the first microlens ML1 may be an axis passing through the center of the first pixel PX1. For example, the light shielding film MS may have a boundary surface passing through the optical axis of the first microlens ML1 and positioned on a plane perpendicular to the third direction. Accordingly, in a plane perpendicular to the first direction, the area of the light shielding film MS may correspond to half (or about half) of the area of the first pixel PX1. The light shielding film MS may overlap a portion of the first photodiode PD1 and the second photodiode PD2 in the first direction.

Referring to FIGS. 10 and 12 together, the image sensors 300A and 300B according to some example embodiments may include light shielding films MS disposed at different positions in the third direction, based on a boundary surface passing through the optical axis of the first microlens ML1 in the second direction (e.g., the x direction). As an example, the image sensor 300A illustrated in FIG. 10 may include a light shielding film MS disposed on a first position, and the image sensor 300B illustrated in FIG. 12 may include a light shielding film MS disposed on a second position. For example, the first position and the second position may mean upward and downward, respectively, in the third direction with respect to the boundary plane passing through the optical axis of the first microlens ML1. However, this is only an example and the present example embodiments are not limited thereto. For example, the image sensors 300A and 300B may include a plurality of shielding pixels each including a light shielding film MS disposed at a first position and a second position. As an example, a shielding pixel including a light shielding film MS disposed in a first position may be defined as a first shielding pixel, and a shielding pixel including a light shielding film MS disposed at the second position may be a second shielding and may be defined as a pixel. For example, the number of first shielding pixels included in each of the image sensors 300A and 300B may be the same as the number of second shielding pixels.

Referring to FIG. 13, both the first shielding pixel and the second shielding pixel may be included in an array of Bayer color filters arranged in a 2×2 shape. Meanwhile, the first shielding pixel and the second shielding pixel may not be adjacent in both the second direction and the third direction. For example, the first shielding pixel may be the first pixel PX1, and the second shielding pixel may be the fourth pixel PX4. However, this is only an example and the present example embodiments are not limited thereto. For example, the first shielding pixel may be the fourth pixel PX4, and the second shielding pixel may be the first pixel PX1. Also, the first shielding pixel may be the second pixel PX2 or the third pixel PX3, and the second shielding pixel may be the third pixel PX3 or the second pixel PX2.

Referring to FIG. 14, the first shielding pixel and the second shielding pixel may be adjacent in the third direction and may not be adjacent in the second direction. For example, the first shielding pixel may be the second pixel PX2, and the second shielding pixel may be the first pixel PX1. However, this is only an example and the present example embodiments are not limited thereto. For example, the first shielding pixel may be the first pixel PX1, and the second shielding pixel may be the second pixel PX2. Also, the first shielding pixel may be the third pixel PX3 or the fourth pixel PX4, and the second shielding pixel may be the fourth pixel PX4 or the third pixel PX3.

Meanwhile, in the image sensors 300A, 300B, 300C, and 300D according to some example embodiments, the arrangement of the plurality of unit pixels PX1, PX2, PX3, and PX4 the present example embodiments are not limited thereto as illustrated. As an example, the image sensors 300A, 300B, 300C, and 300D may include various pixel arrangements, not only the arrangement of any one plurality of unit pixels PX1, PX2, PX3, and PX4.

Figure 15:
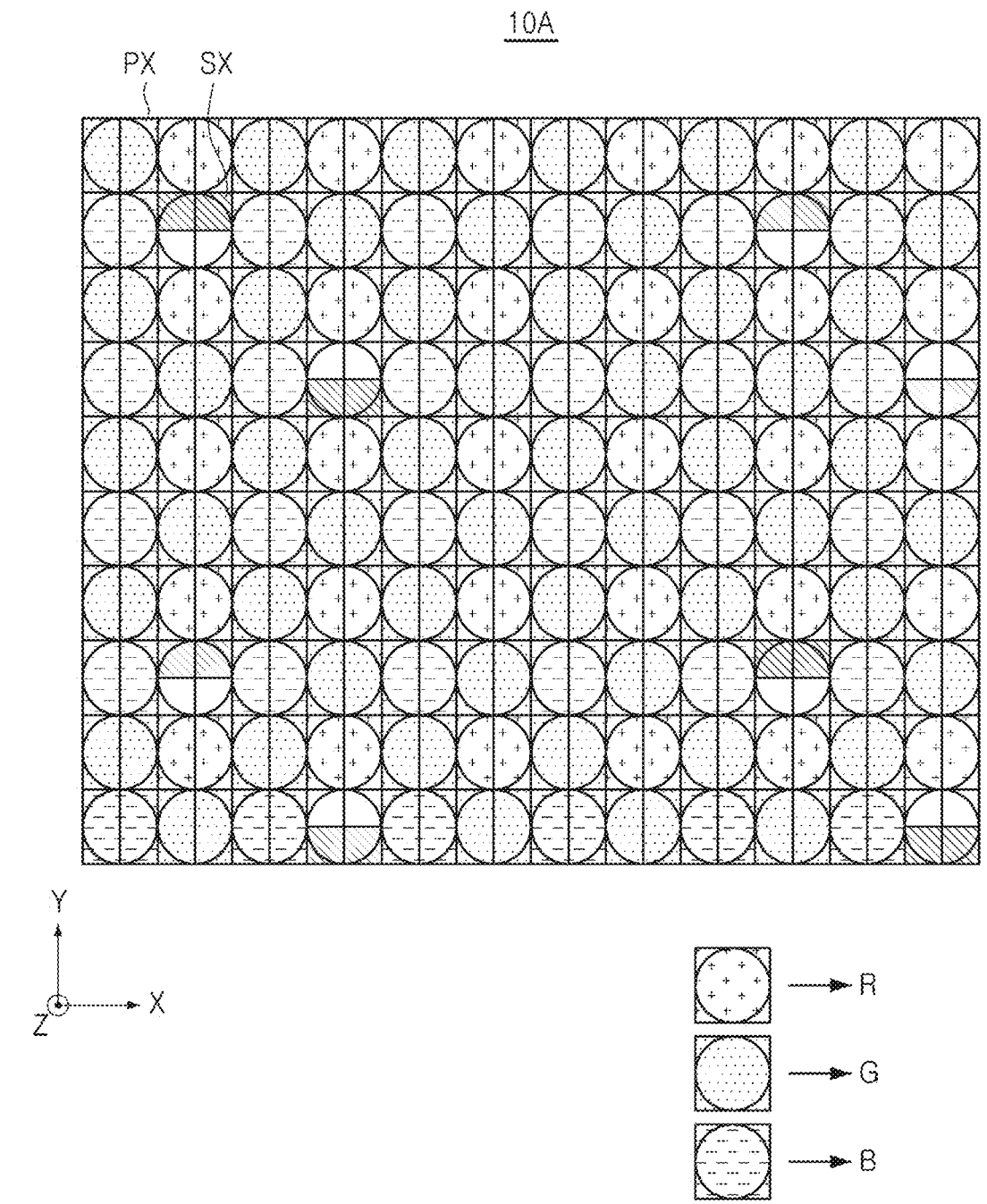
FIGS. 15 and 16 are diagrams illustrating a pixel array included in an image sensor according to example embodiments.
Figure 16:
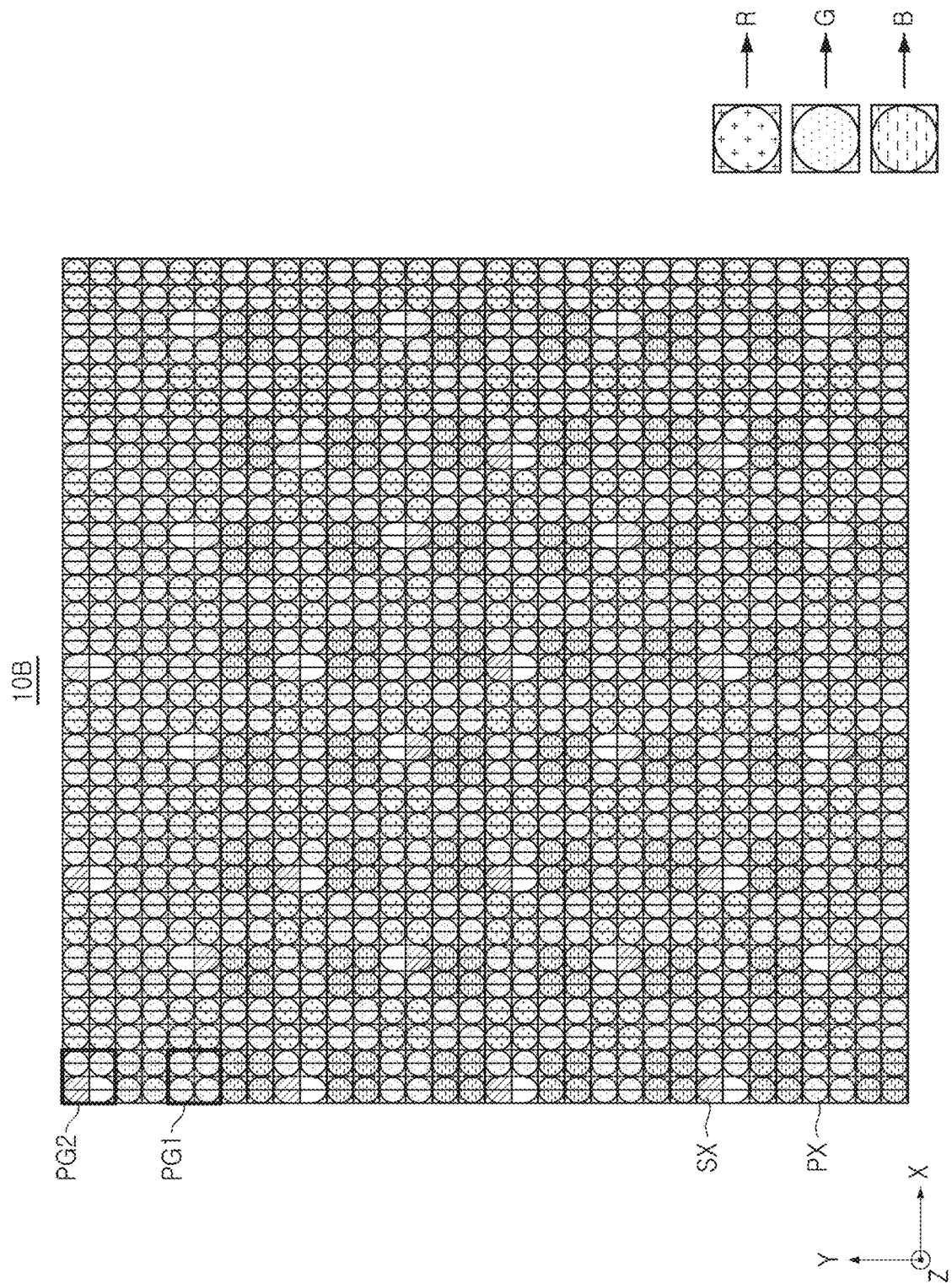

FIGS. 15 and 16 are diagrams illustrating a pixel array included in an image sensor according to example embodiments.

First, referring to FIG. 15, a pixel array 10A of an image sensor according to some example embodiments may include a plurality of unit pixels PX. For example, the pixel array 10A may include normal pixels and autofocusing pixels. Each of the general pixels and the autofocusing pixel may be plural, and the number may be variously modified. For example, the pixel array 10A of the image sensor may include only autofocusing pixels. However, this is only an example of the example embodiments, the present example embodiments are not limited thereto, and the number of normal pixels may be greater than the number of autofocusing pixels. Also, the position of the autofocusing pixel is not limited and may be variously modified.

The autofocusing pixel may include a first photodiode and a second photodiode. In the autofocusing pixel, the first photodiode and the second photodiode may be arranged along one direction (horizontal direction), and the first photodiode and the second photodiode may share one microlens. However, this is only an example of the example embodiments, the present example embodiments are not limited thereto, and two unit pixels adjacent in a third direction (e.g., y direction) may share one microlens. Alternatively or additionally, according to example embodiments, in some of the autofocusing pixels, the first photodiode and the second photodiode may be arranged in a different direction.

Meanwhile, the pixel array 10A of the image sensor may include a shielding pixel SPX including a light shielding film. For example, the shielding pixel SPX may detect a phase difference in the vertical direction of incident light. Accordingly, the shielding pixel SPX may be used to supplement the autofocusing performance in the vertical direction of the image sensor. Meanwhile, the shielding pixel SPX may be a defective pixel in terms of detecting a pixel signal and performing an image sensing operation. Accordingly, an additional adjustment algorithm for processing the shielding pixel SPX may be applied during the operation of the image sensor.

The pixel array 10A of the image sensor according to some example embodiments may include a color filter having an arrangement to generate an image having a Bayer pattern. For example, in the pixel array 10A of the image sensor, a 2×2 Bayer color filter array arranged in the order of red, green, green, and blue may be repeatedly configured. However, this is only an example of the example embodiments, and an arrangement of repetitively configured color filters may vary. For example, a white color filter may be included in the color filter arrangement. As an example, a shielding pixel including a light shielding film may include a white color filter.

The pixel arrangement of the pixel array 10A including the Bayer color filter arrangement is not limited to the example embodiments illustrated in FIG. 15. As an example, the pixel arrangement of the pixel array 10A may have the pixel arrangement illustrated in FIGS. 3, 8 to 10, and 12 to 14. However, this is only an example and the present example embodiments are not limited thereto. For example, the pixel array 10A of the image sensor according to some example embodiments may have an arrangement other than the above-described pixel arrangement, and may have a plurality of different pixel arrangements. The pixel arrangement of the pixel array 10A including the shielding pixel SPX may need to be appropriately designed as required, or desired, in consideration of the performance of the image sensor.

Meanwhile, referring to FIG. 16, the pixel array 10B may include a plurality of pixel groups PG1 and PG2 arranged in a direction parallel to the upper surface of the substrate. Alternatively or additionally, the plurality of pixel groups PG1 and PG2 may each include a plurality of unit pixels PX, and each of the plurality of unit pixels PX may include a first photodiode and a second photodiode. However, according to example embodiments, only some of the unit pixels PX may include the first photodiode and the second photodiode, or at least some of the unit pixels PX may include the first photodiode and the second photodiode. The arrangement direction may be different. Meanwhile, the pixel array 10A illustrated in FIG. 15 may be defined as a pixel array 10A including pixel groups each including one unit pixel PX.

Meanwhile, the pixel array 10B of the image sensor may include a shielding pixel SPX including a light shielding film. The plurality of pixel groups PG1 and PG2 may include a first pixel group PG1 not including the shielding pixel SPX and a second pixel group PG2 including the shielding pixel SPX. The light shielding film included in the shielding pixel SPX may overlap at least a portion of the first photodiode and the second photodiode in the first direction. However, this is only an example of the example embodiments, the present example embodiments are not limited thereto, and when the image sensor does not include the shielding pixel SPX, the second pixel group PG2 may be defined as a pixel group including modified second pixel to supplement the autofocusing performance in the vertical direction.

The pixel array 10B of the image sensor according to some example embodiments may include a color filter having an arrangement to generate an image having a Tetra pattern. As an example, the pixel array 10B of the image sensor may have a 4×4 tetra color filter array in which red, green, green, and blue are each arranged in a 2×2 shape. Meanwhile, each of the plurality of pixel groups PG1 and PG2 may include 2×2 unit pixels PX. In detail, the 2×2 unit pixels PX included in the plurality of pixel groups PG may include color filters of the same color. As an example, the array of tetra color filters repeatedly arranged as described above may constitute the pixel array 10B. However, this is only an example of the example embodiments, and an arrangement of repetitively configured color filters may vary. Meanwhile, the shielding pixel SPX may include a white color filter. Accordingly, the second pixel group PG2 including the shielding pixel SPX may include color filters of different colors.

Meanwhile, the pixel arrangement of the pixel array 10B including the tetra color filter arrangement is not limited to the example embodiments illustrated in FIG. 16. Example embodiments related to the pixel arrangement of the pixel array 10B will be described later.

FIGS. 17 to 31 are top views of an image sensor according to example embodiments.

Figure 17:
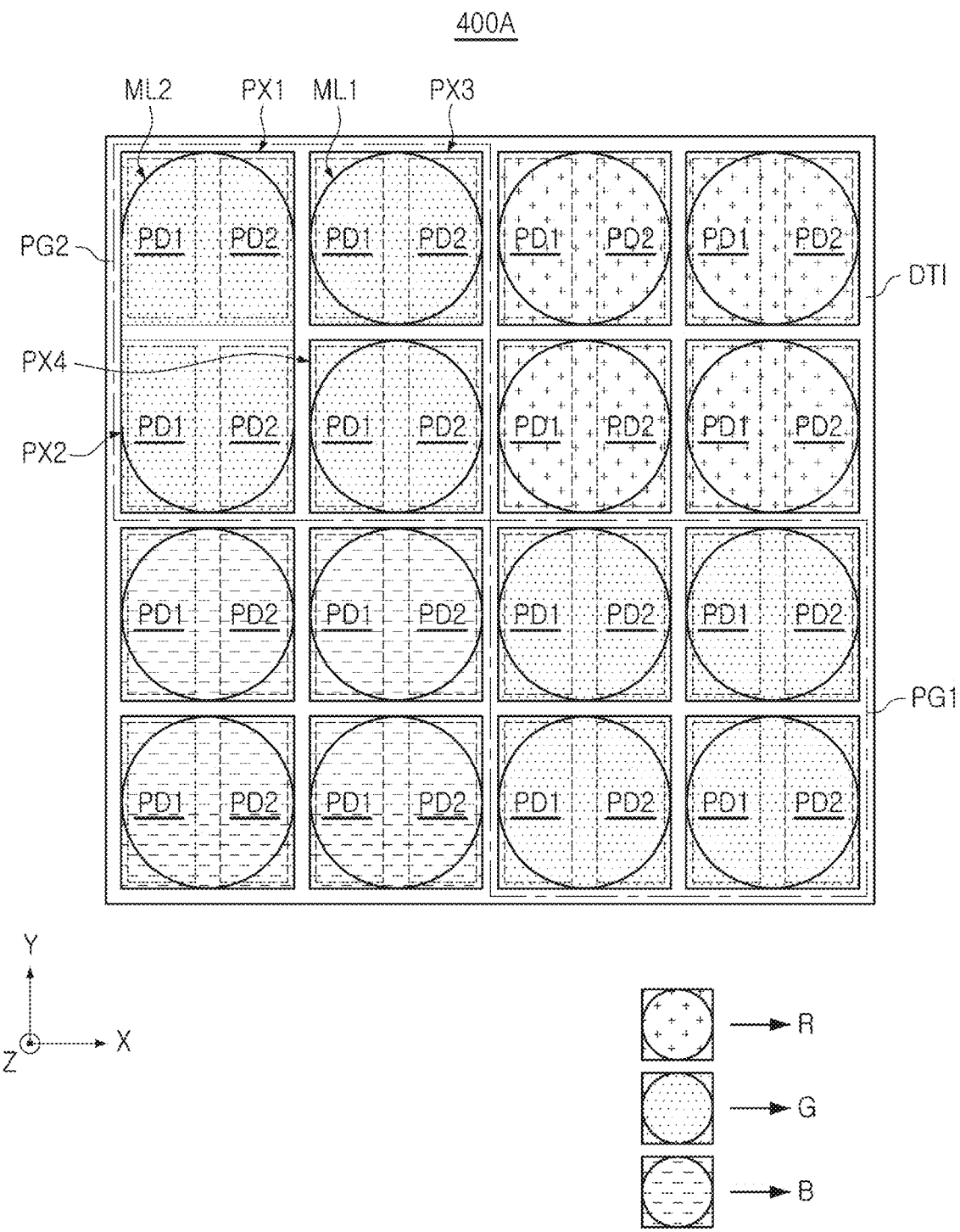
FIGS. 17 and 18 are top views of an image sensor according to example embodiments.
Figure 18:
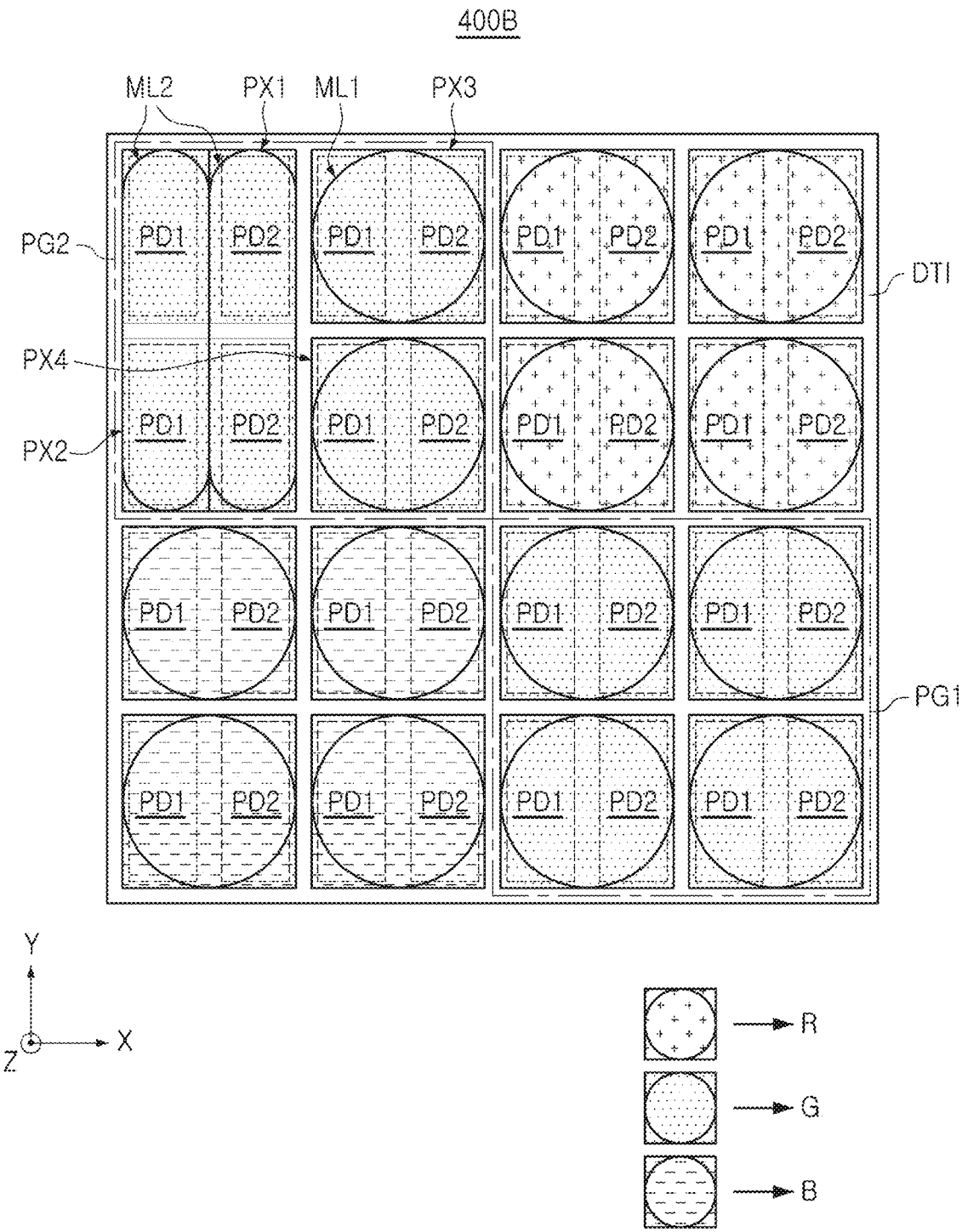

FIGS. 17 and 18 may be top views of image sensors 400A and 400B including the modified second microlens ML2 without a light shielding film.

Referring to FIGS. 17 and 18, image sensors 400A and 400B according to example embodiments may include first and second photodiodes PD1 and PD2 separated in a second direction (e.g., x direction) inside a semiconductor substrate, a device isolation film DTI disposed between the plurality of unit pixels PX1, PX2, PX3, and PX4, and microlenses ML1 and ML2. As an example, the image sensors 400A and 400B may be an image sensor changed to include a color filter having a tetra color filter arrangement in the image sensors 200A and 200B illustrated in FIGS. 8 and 9. Other components may correspond to the image sensors 200A and 200B.

Meanwhile, the image sensors 400A and 400B may include a first pixel group PG1 including unit pixels including only the first microlens ML1, and a second pixel group PG2 including unit pixels including the modified second microlens ML2. As an example, a second microlens ML2 may be disposed above the first pixel PX1 and the second pixel PX2 among a plurality of unit pixels PX1, PX2, PX3, and PX4 included in the second pixel group PG2, and a first microlens ML1 may be disposed on the third pixel PX3 and the fourth pixel PX4. As an example, the first pixel PX1 and the second pixel PX2 may be unit pixels disposed side-by-side in a third direction (e.g., a y direction). As an example, the first microlens ML1 may be a microlens corresponding to each of the third pixel PX3 and the fourth pixel PX4, and at least one of the first pixel PX1 and the second pixel PX2 may share the second microlens ML2.

Referring to FIG. 17, in the image sensor 400A according to some example embodiments, a first pixel PX1 and a second pixel PX2 may share one second microlens ML2. As an example, since each of the plurality of unit pixels PX1, PX2, PX3, and PX4 includes first and second photodiodes PD1 and PD2, one second microlens ML2 may be disposed above the two first photodiodes PD1 and the two second photodiodes PD2 in the first pixel PX1 and the second pixel PX2.

Meanwhile, referring to FIG. 18, in the image sensor 400B according to some example embodiments, a first pixel PX1 and a second pixel PX2 may share two second microlenses ML2. As an example, since each of the plurality of unit pixels PX1, PX2, PX3, and PX4 includes first and second photodiodes PD1 and PD2, each of the second microlenses ML2 has a first pixel PX1, and the second pixel PX2 may be disposed above the two first photodiodes PD1 or the two second photodiodes PD2.

FIGS. 19 to 26 are top views of image sensors 500A, 500B, 500C, 500D, 500E, 500F, 500G, 500H including a light shielding film MS and including a first microlens ML1.

The image sensors 500A, 500B, 500C, 500D, 500E, 500F, 500G, 500H according to some example embodiments may include a first and second photodiodes PD1 and PD2 separated from the inside of the semiconductor substrate in the second direction (e.g., the x direction), a device isolation film DTI disposed between the plurality of unit pixels PX1, PX2, PX3, and PX4, first microlenses ML1 having the same size, and a light shielding film MS. As an example, the image sensors 500A, 500B, 500C, 500D, 500E, 500F, 500G and 500H may be image sensors modified to include a color filter having the arrangement of tetra color filters from the image sensors 300A, 300B, 300C, and 300D illustrated in FIG. 10 and FIGS. 12 to 14. Other configurations may correspond to the image sensors 300A, 300B, 300C, and 300D.

Meanwhile, the image sensors 500A, 500B, 500C, 500D, 500E, 500F, 500G, and 500H may include a first pixel group PG1 including unit pixels not including a light shielding film MS, and a second pixel group PG2 including a light shielding film MS for blocking a portion of incident light. In this case, the unit pixel including the light shielding film MS may be a shielding pixel. For example, the light shielding film MS may have a boundary surface that passes through the optical axis of the first microlens ML1 and is positioned on a plane perpendicular to the third direction. Accordingly, in a plane perpendicular to the first direction, the area of the light shielding film MS may correspond to half (or about half) of the area of the shielding pixel.

As an example, the light shielding film MS may be disposed at a first position or a second position different from each other in the third direction with respect to the boundary surface passing through the optical axis of the first microlens ML1. As an example, a shielding pixel including a light shielding film MS disposed in a first position may be defined as a first shielding pixel, and a shielding pixel including a light shielding film MS disposed in the second position may be a second shielding and may be defined as a pixel. Meanwhile, the arrangement and number of the light shielding films MS may vary according to example embodiments. The number of first shielding pixels included in each of the image sensors 500A, 500B, 500C, 500D, 500E, 500F, 500G, and 500H may be the same as the number of second shielding pixels.

Figure 19:
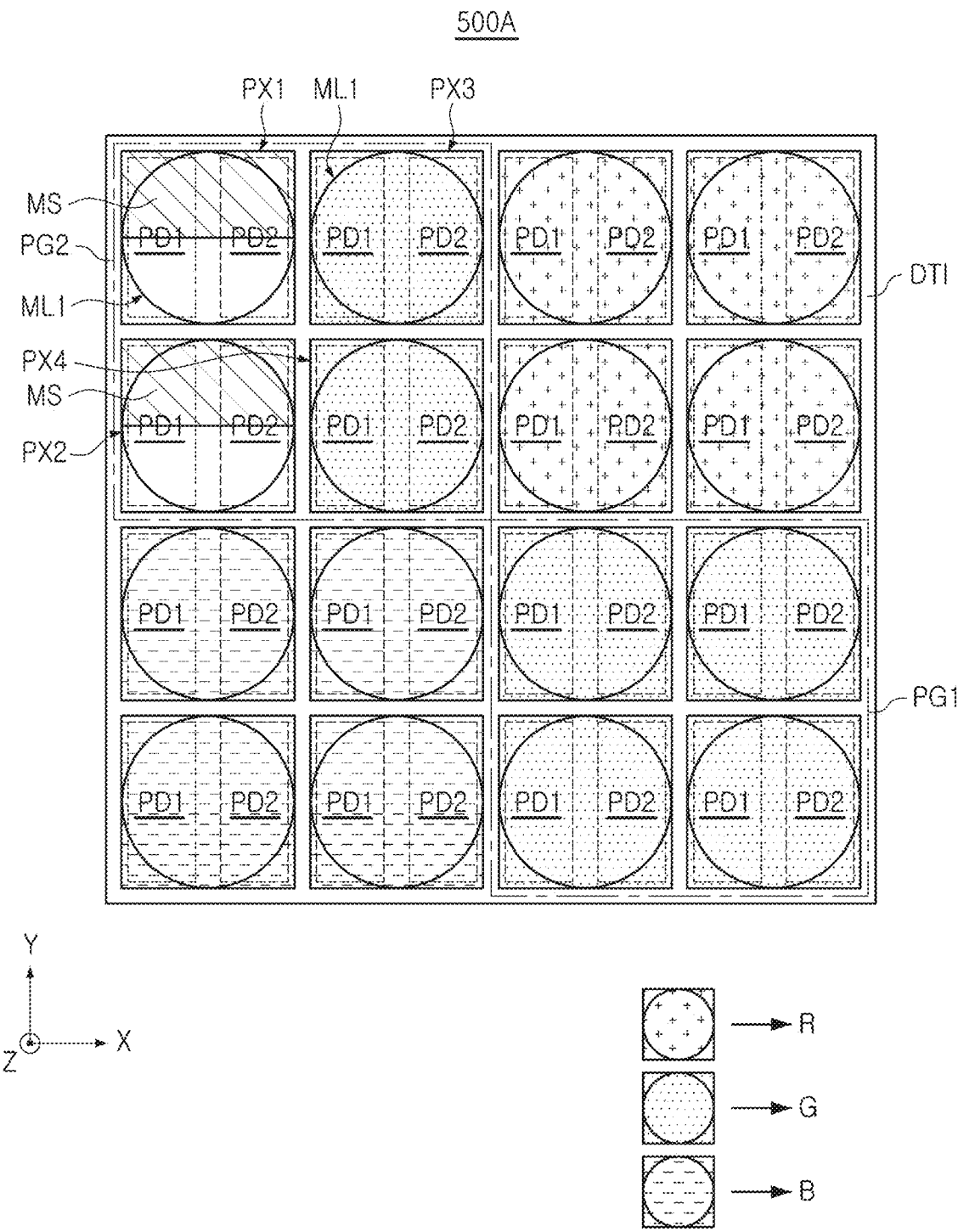
FIGS. 19 to 26 are top views of an image sensor according to example embodiments.

Referring to FIG. 19, one second pixel group PG2 may include two shielding pixels. For example, the two shielding pixels may include a light shielding film MS disposed in the same position. Meanwhile, the two shielding pixels may be adjacent to each other in the third direction. For example, the first pixel PX1 and the second pixel PX2 included in the second pixel group PG2 may be first shielding pixels. However, the present disclosure is not limited thereto, and the first pixel PX1 and the second pixel PX2 may be second shielding pixels. Also, the third pixel PX3 and the fourth pixel PX4 included in the second pixel group PG2 may be a first shielding pixel or a second shielding pixel.

Figure 20:
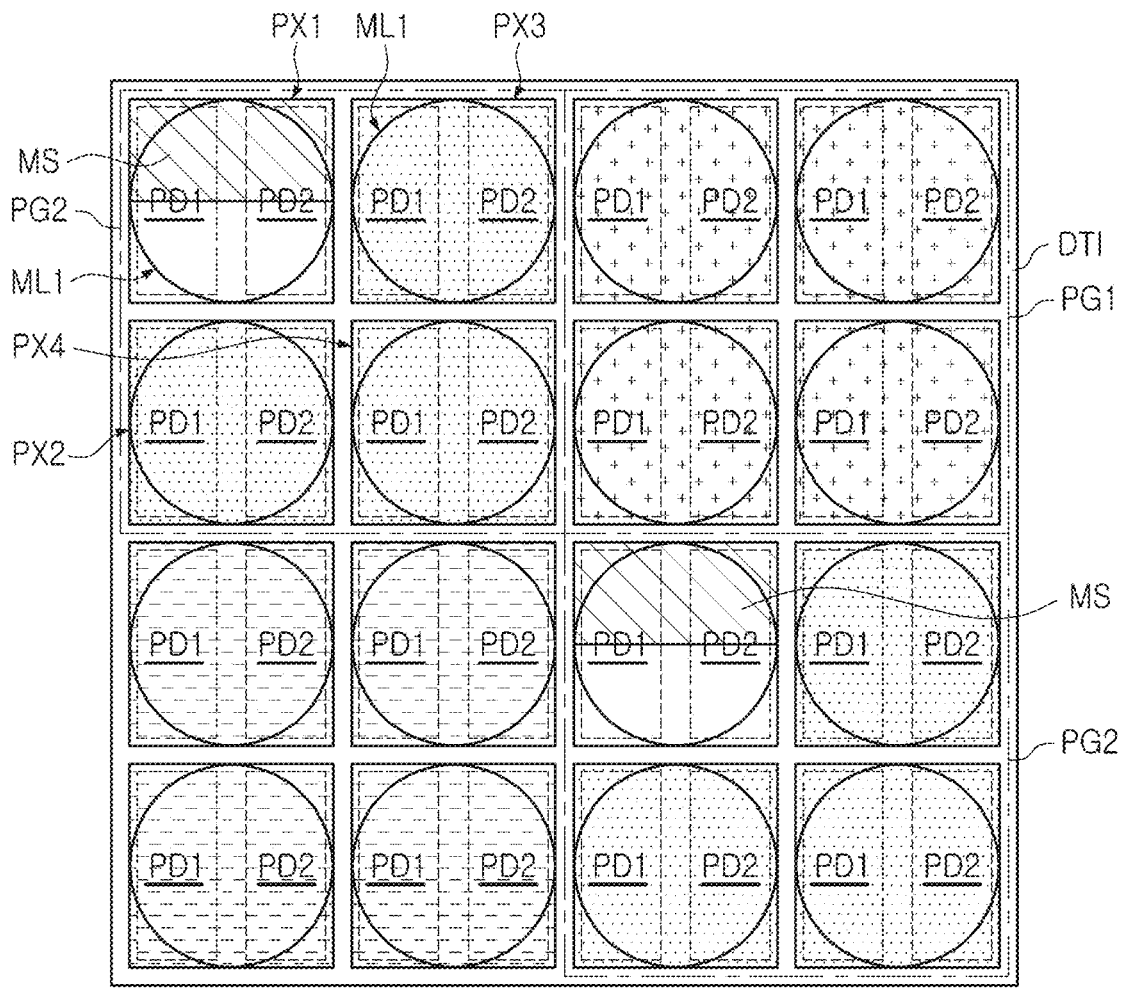
Figure 20:
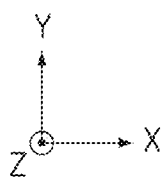
Figure 20:
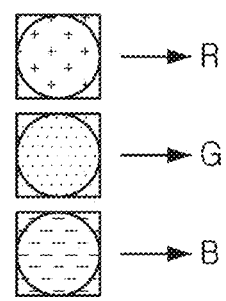

Referring to FIG. 20, unit pixels having one tetra color filter arrangement may include two second pixel groups PG2. For example, one second pixel group PG2 may include one shielding pixel. For example, the second pixel group PG2 may include a shielding pixel including a light shielding film MS disposed at the same position. For example, each of the second pixel groups PG2 may include a first shielding pixel.

Figure 21:
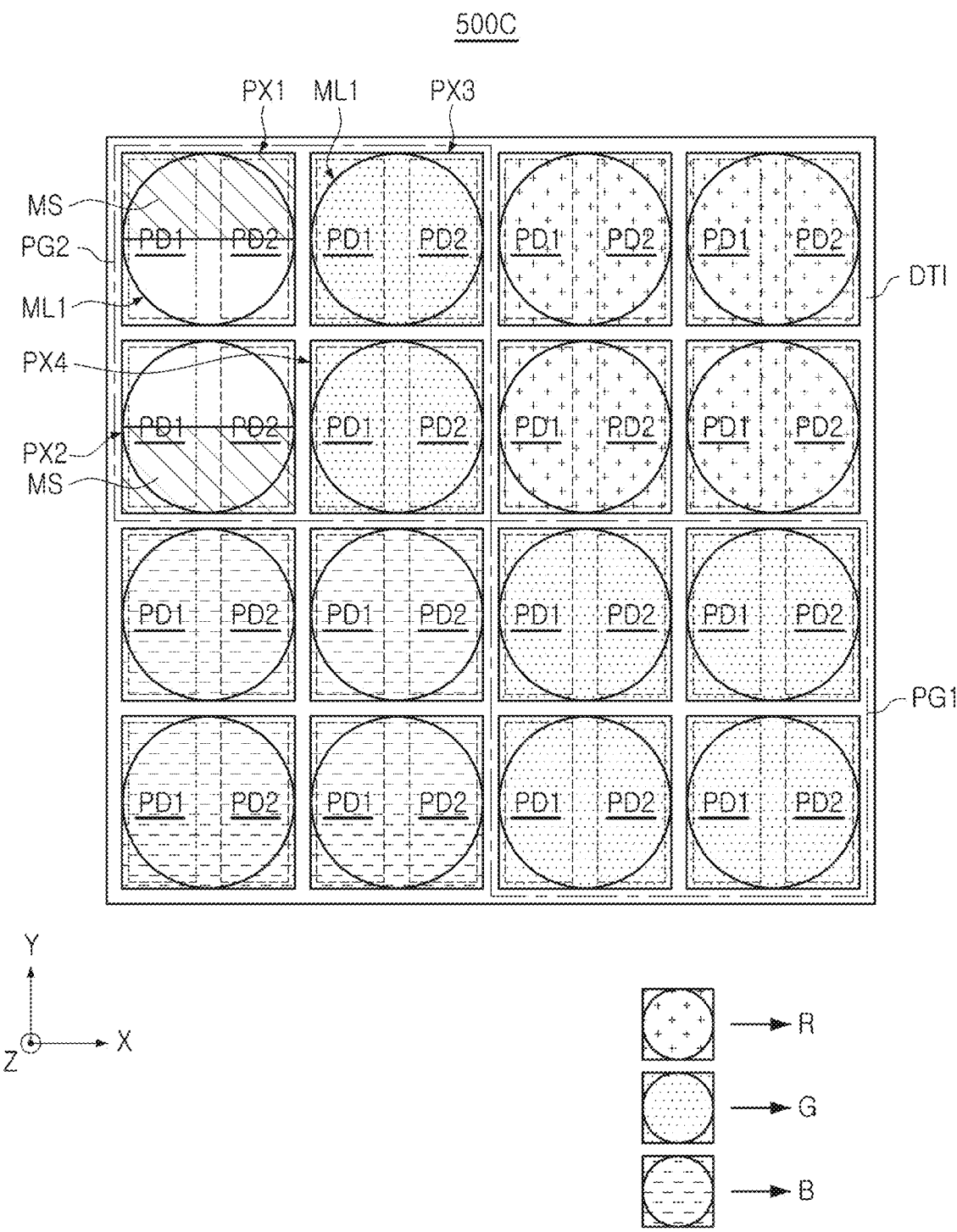
Figure 22:
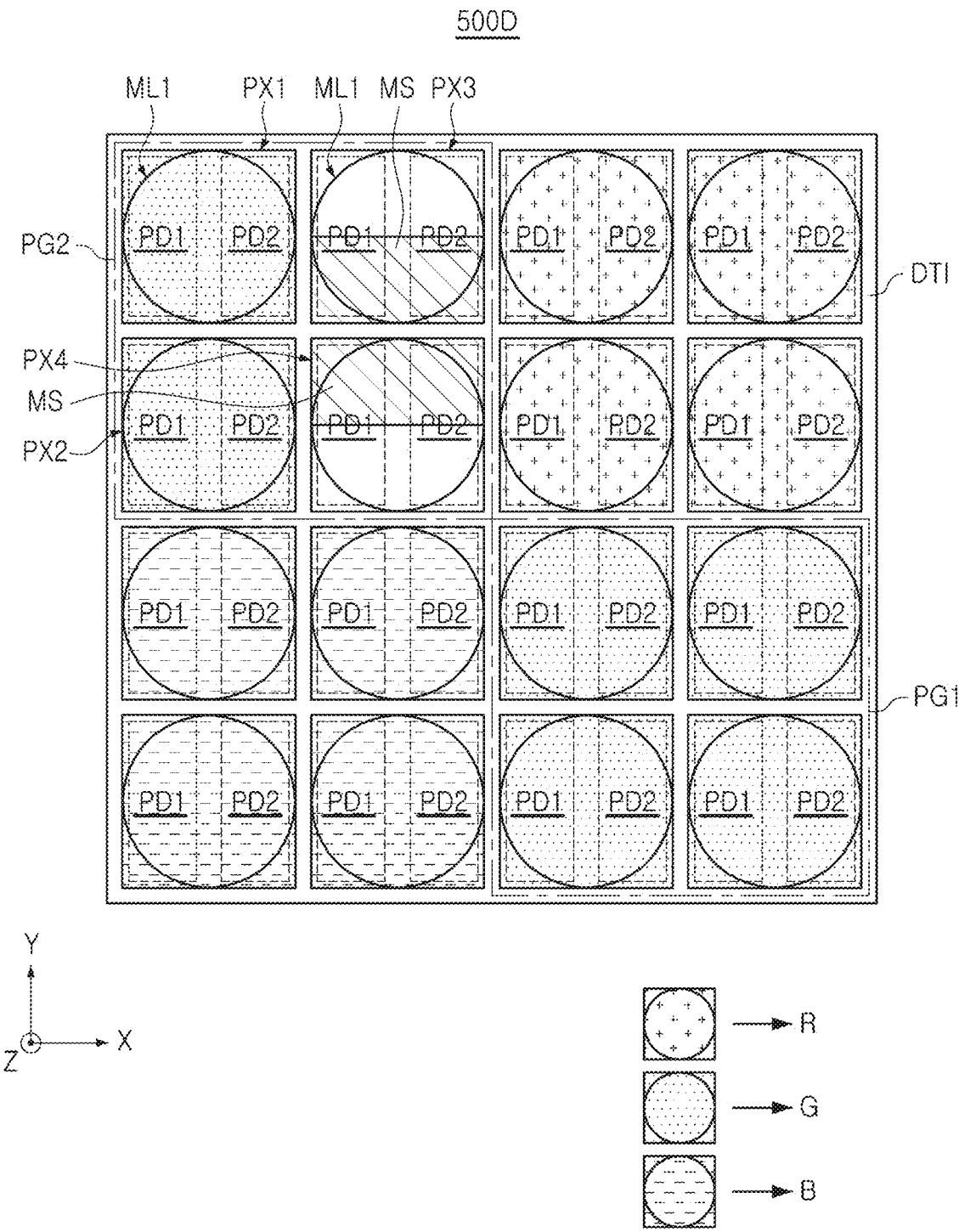

FIGS. 21 and 22, one second pixel group PG2 may include two shielding pixels. For example, the two shielding pixels may include light shielding films MS disposed at different positions. Meanwhile, the two shielding pixels may be adjacent to each other in the third direction. As an example, in the image sensor 500C illustrated in FIG. 21, the first pixel PX1 included in the second pixel group PG2 may be a first shielding pixel, and the second pixel PX2 may be a second shielding pixel. Meanwhile, in the image sensor 500D illustrated in FIG. 22, the third pixel PX3 included in the second pixel group PG2 may be a second shielding pixel, and the fourth pixel PX4 may be a first shielding pixel. However, the present disclosure is not limited thereto, and the first pixel PX1 may be a second shielding pixel, and the second pixel PX2 may be a first shielding pixel. Also, the third pixel PX3 included in the second pixel group PG2 may be a first shielding pixel, and the fourth pixel PX4 may be a second shielding pixel.

Figure 23:
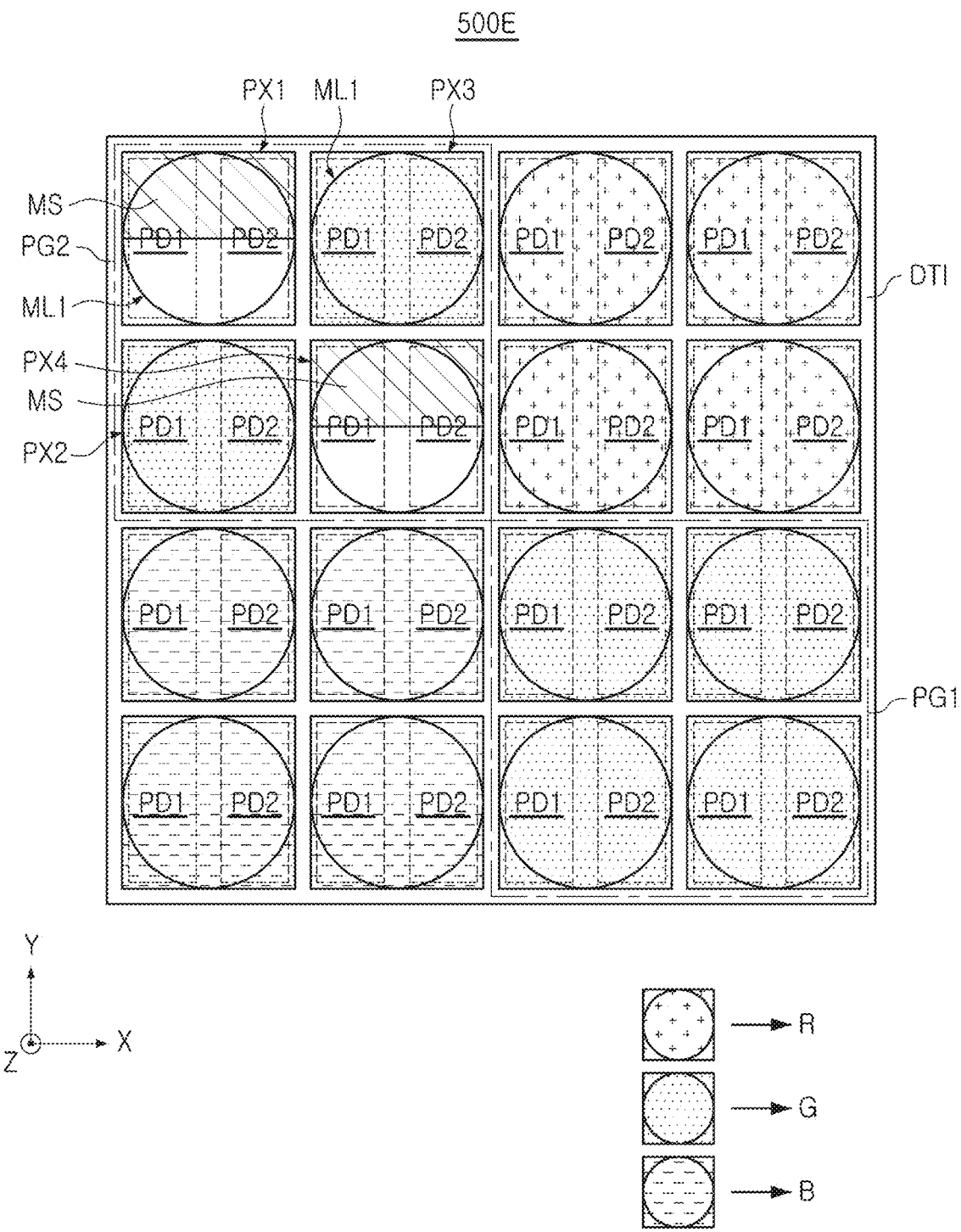
Figure 24:
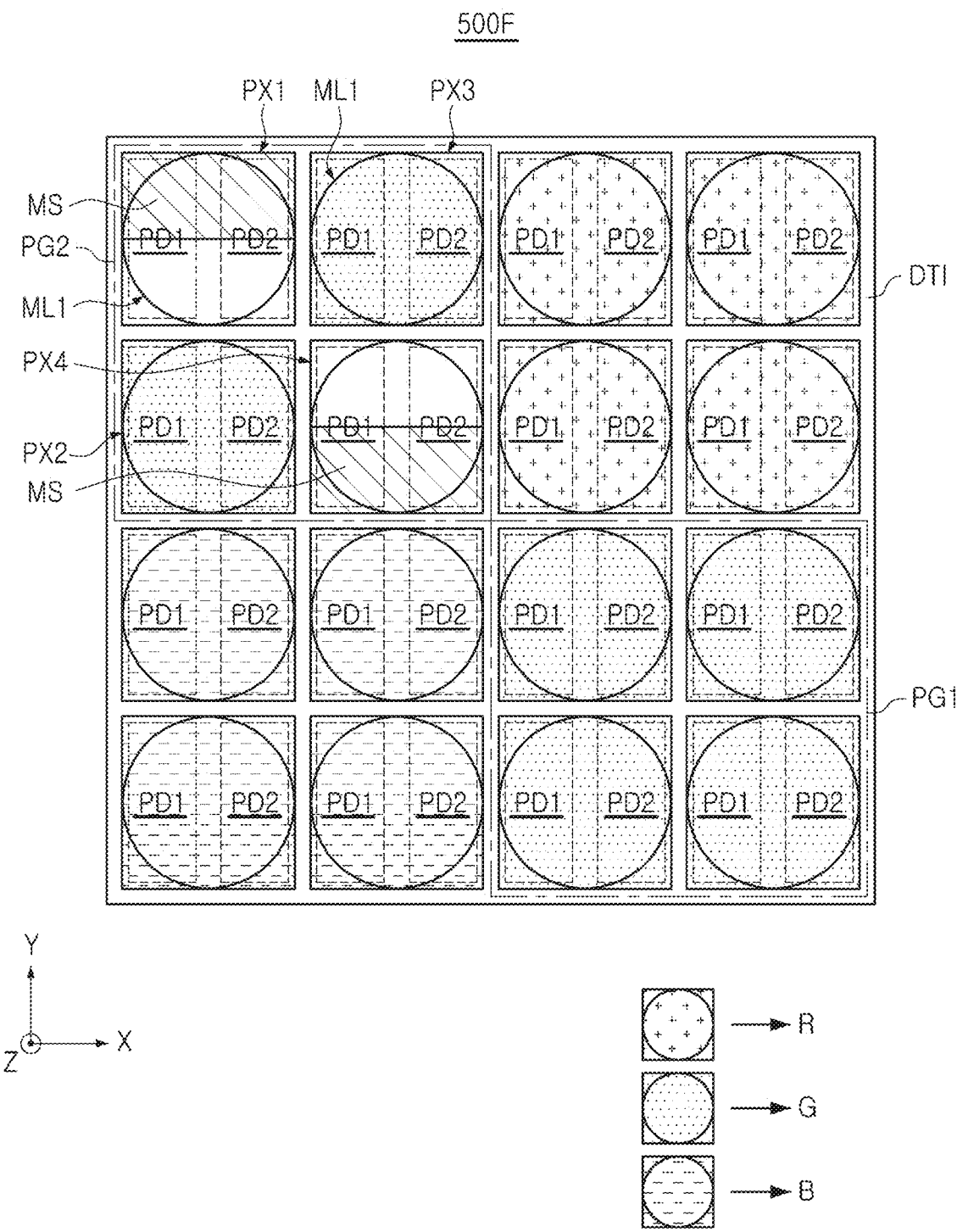

Referring to FIGS. 23 and 24, one second pixel group PG2 may include two shielding pixels. Meanwhile, the two shielding pixels may not be adjacent to each other in the second direction and the third direction. For example, the two shielding pixels may include a light shielding film MS disposed at the same location or at different locations. For example, the first pixel PX1 and the fourth pixel PX4 included in the second pixel group PG2 may be first shielding pixels. Alternatively, the first pixel PX1 may be a first shielding pixel, and the fourth pixel PX4 may be a second shielding pixel. However, the present example embodiments are not limited thereto. For example, the second pixel PX2 and the third pixel PX3 included in the second pixel group PG2 may be shielding pixels. For example, referring to FIG. 26, the second pixel PX2 may be a first shielding pixel, and the third pixel PX3 may be a second shielding pixel.

Figure 25:
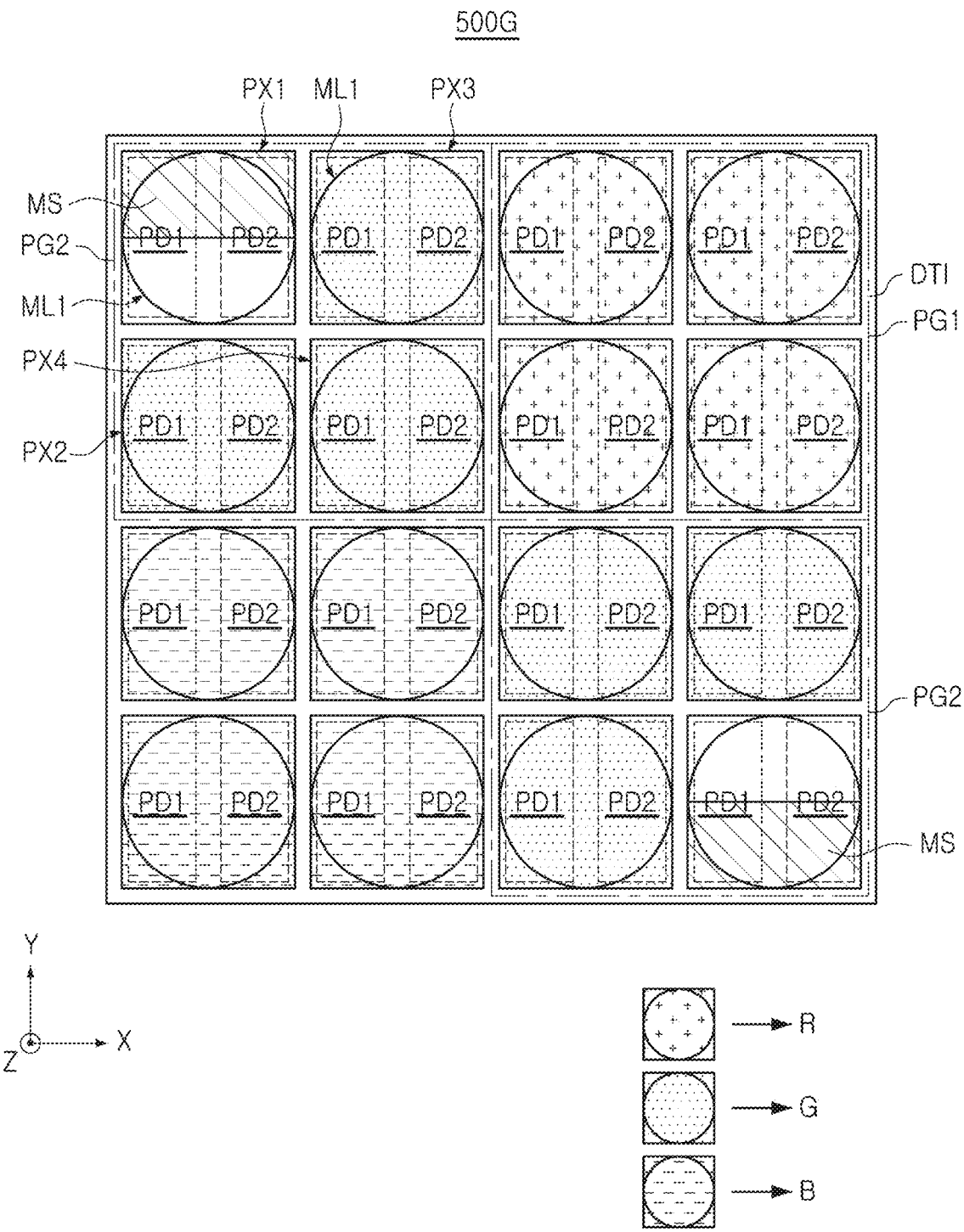
Figure 26:
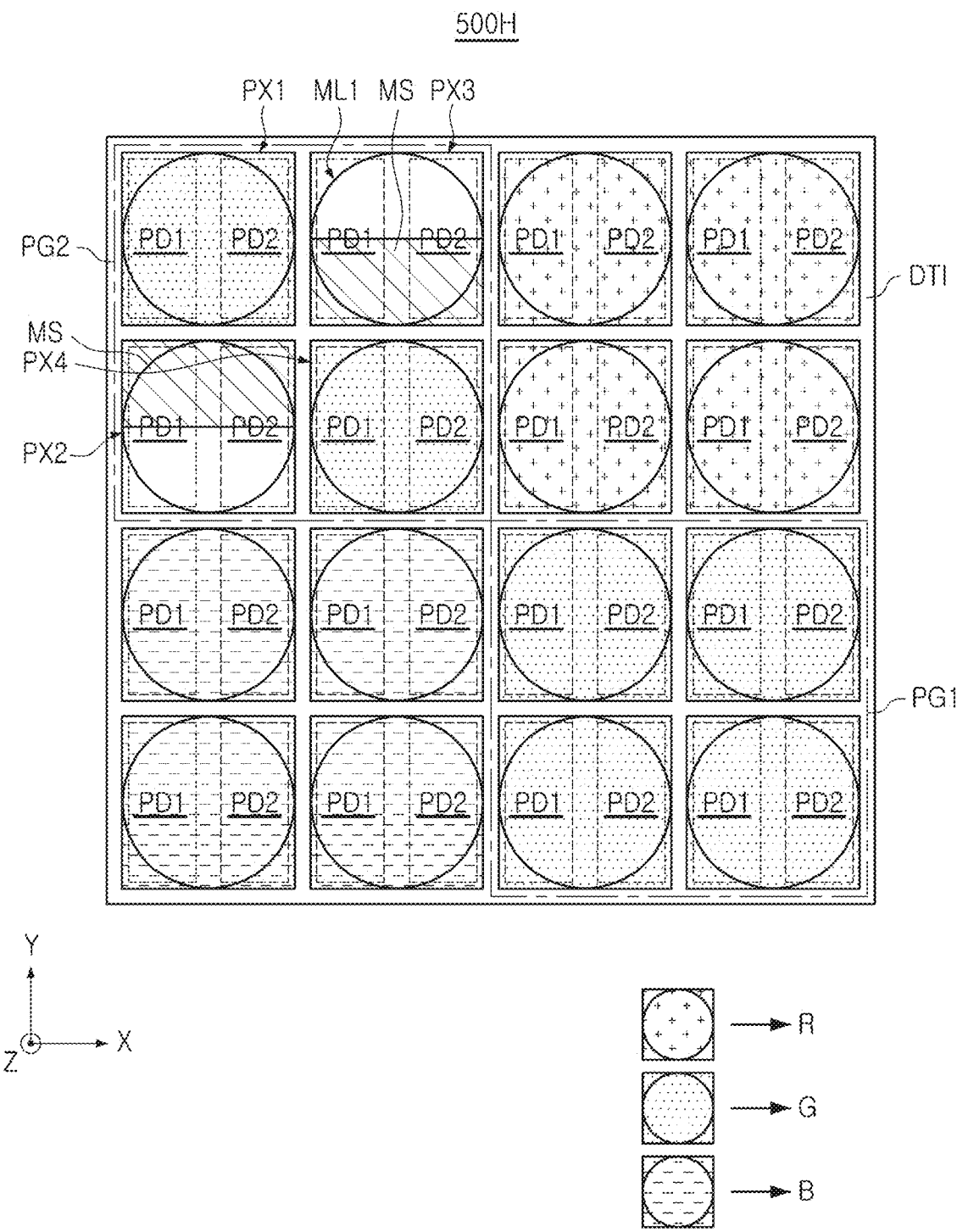

Referring to FIG. 25, unit pixels having one tetra color filter arrangement may include two second pixel groups PG2. For example, one second pixel group PG2 may include one shielding pixel. For example, the second pixel group PG2 may include shielding pixels including light shielding films MS disposed at different positions. For example, each of the second pixel groups PG2 may include a first shielding pixel and a second shielding pixel. Meanwhile, shielding pixels included in each of the second pixel group PG2 may be disposed at different positions. As an example, in the second pixel group PG2 including the first shielding pixel, the first shielding pixel may be the first pixel PX1, and in the second pixel group PG2 including the second shielding pixel, the second shielding pixel may be a unit pixel disposed at a position corresponding to the fourth pixel PX4.

FIGS. 27 to 31 may be top views of image sensors 600A, 600B, 600C, 600D and 700 including the light shielding film MS and the modified second microlens ML2.

Referring to FIGS. 27 to 31, the image sensors 600A, 600B, 600C, 600D, and 700 may include first and second photodiodes PD1 and PD2 separated in a second direction (e.g., x direction) inside a semiconductor substrate, the device isolation film DTI disposed between the plurality of unit pixels PX1, PX2, PX3, and PX4, the first microlens ML1, a second microlens ML2 modified from the first microlens ML1, and a light shielding film MS.

Referring to FIGS. 27 to 30, a unit pixel including the light shielding film MS may correspond to the second microlens ML2. In detail, the light shielding film MS may overlap the second microlens ML2 in the first direction. Meanwhile, the positions of the second microlens ML2 and the light shielding film MS may vary according to some example embodiments.

Figure 27:
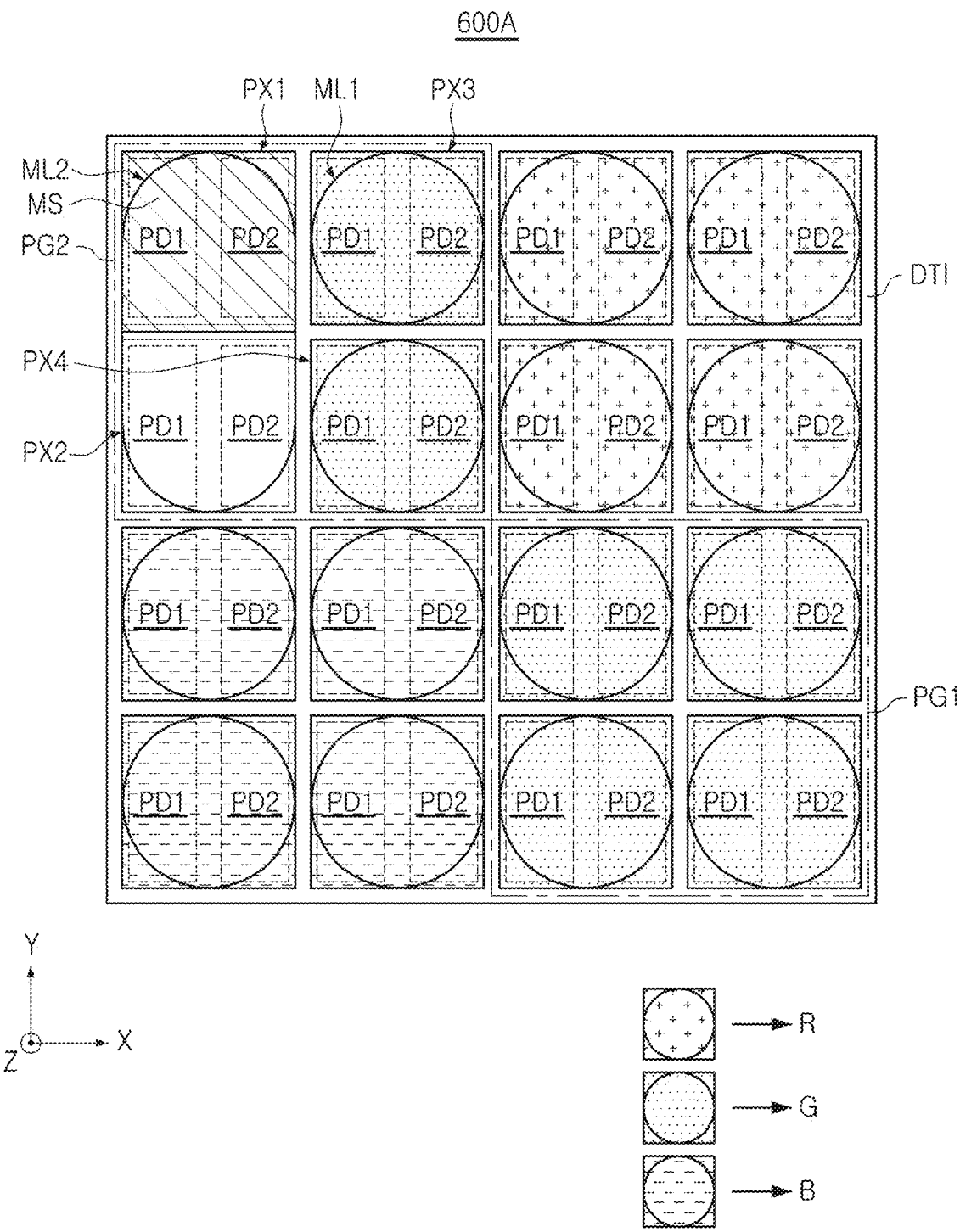
FIGS. 27 to 30 are top views of an image sensor according to example embodiments.

Referring to FIG. 27, a first pixel PX1 and a second pixel PX2 may share a second microlens ML2. Meanwhile, the first pixel PX1 may include the light shielding film MS, and the first pixel PX1 may be defined as a first shielding pixel according to the position of the light shielding film MS.

However, this is only an example and the present example embodiments are not limited thereto.

Figure 28:
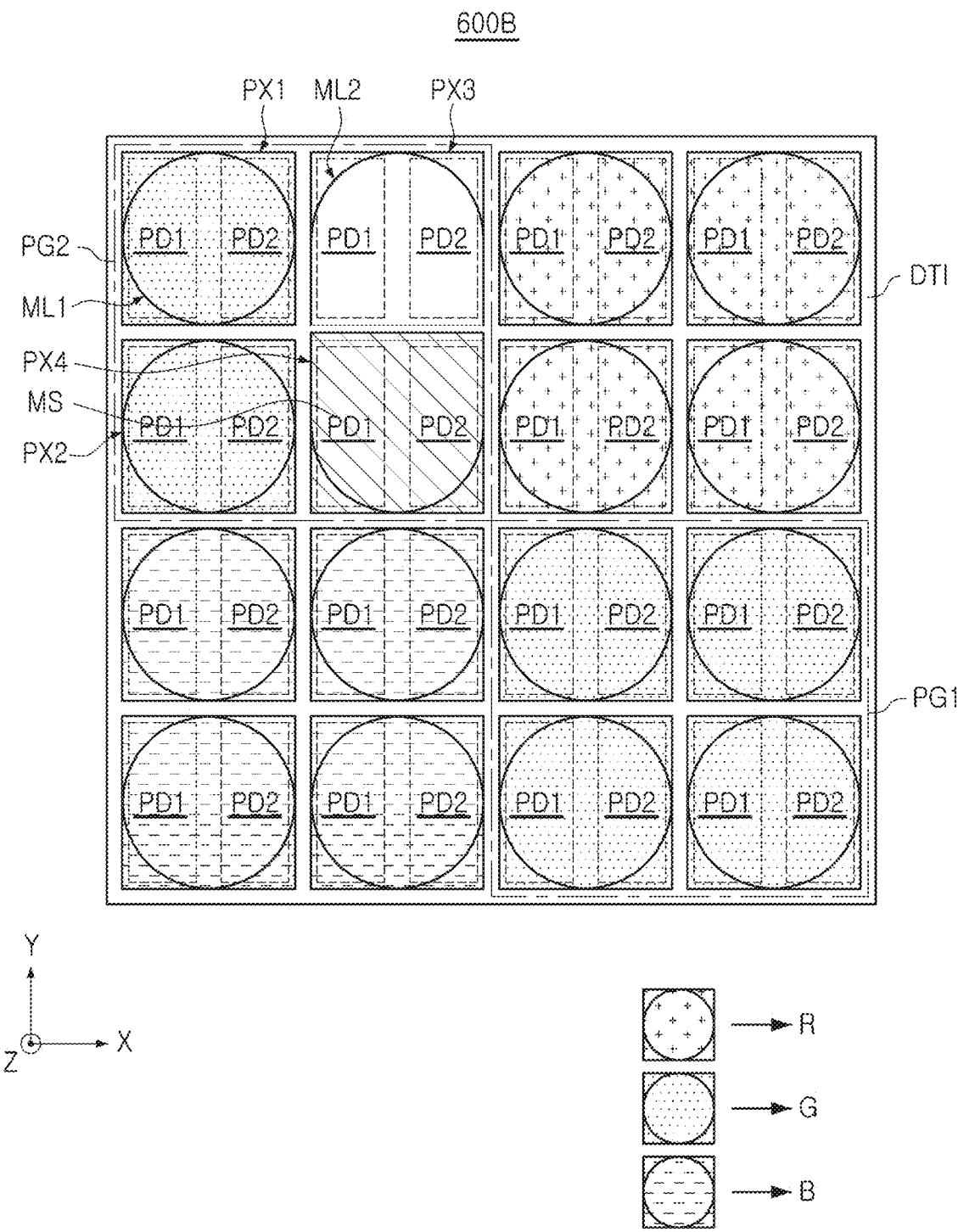

For example, referring to FIG. 28, the third pixel PX3 and the fourth pixel PX4 may share the second microlens ML2. Meanwhile, the fourth pixel PX4 may include the light shielding film MS, and the fourth pixel PX4 may be defined as a second shielding pixel according to the position of the light shielding film MS.

Figure 29:
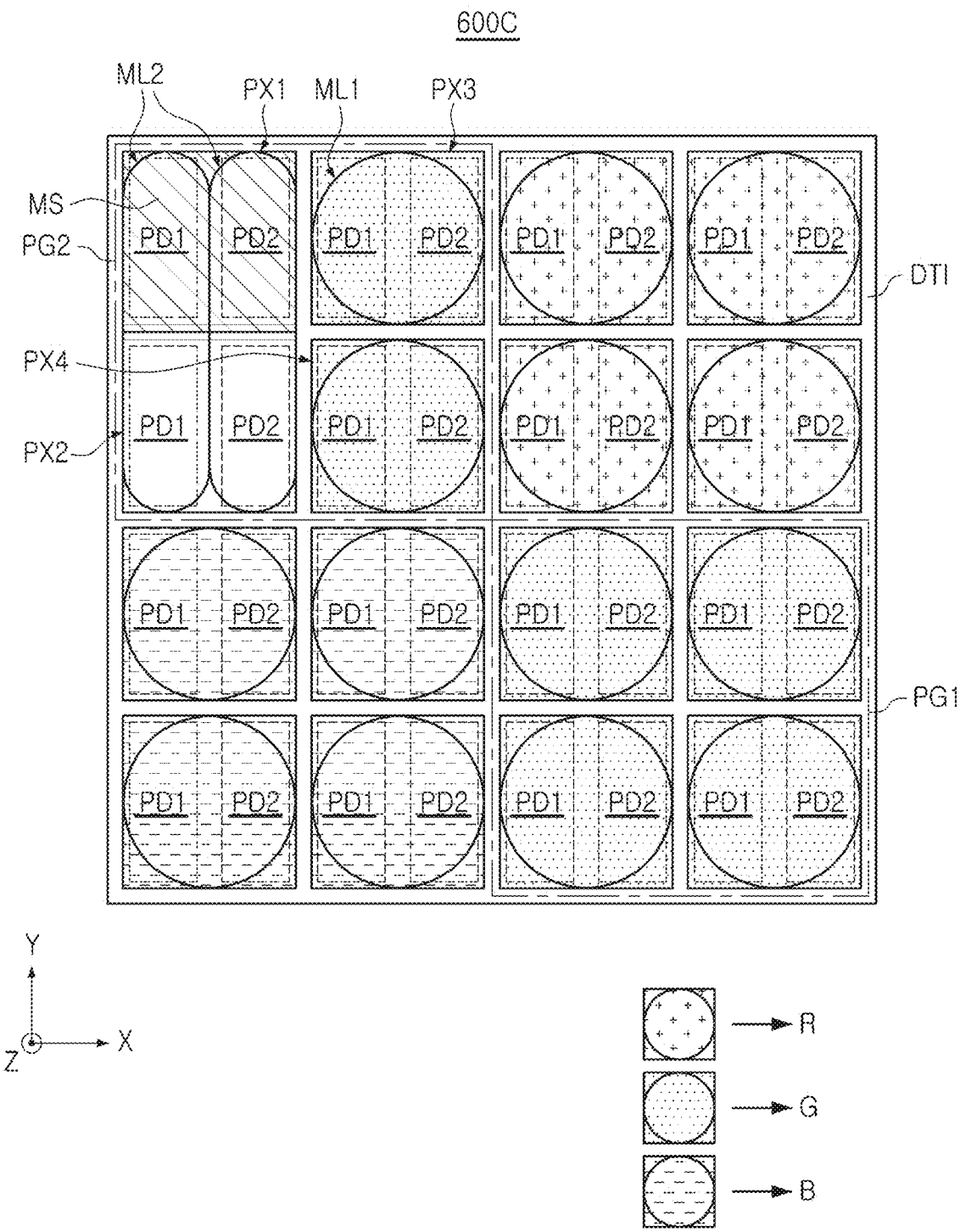
Figure 30:
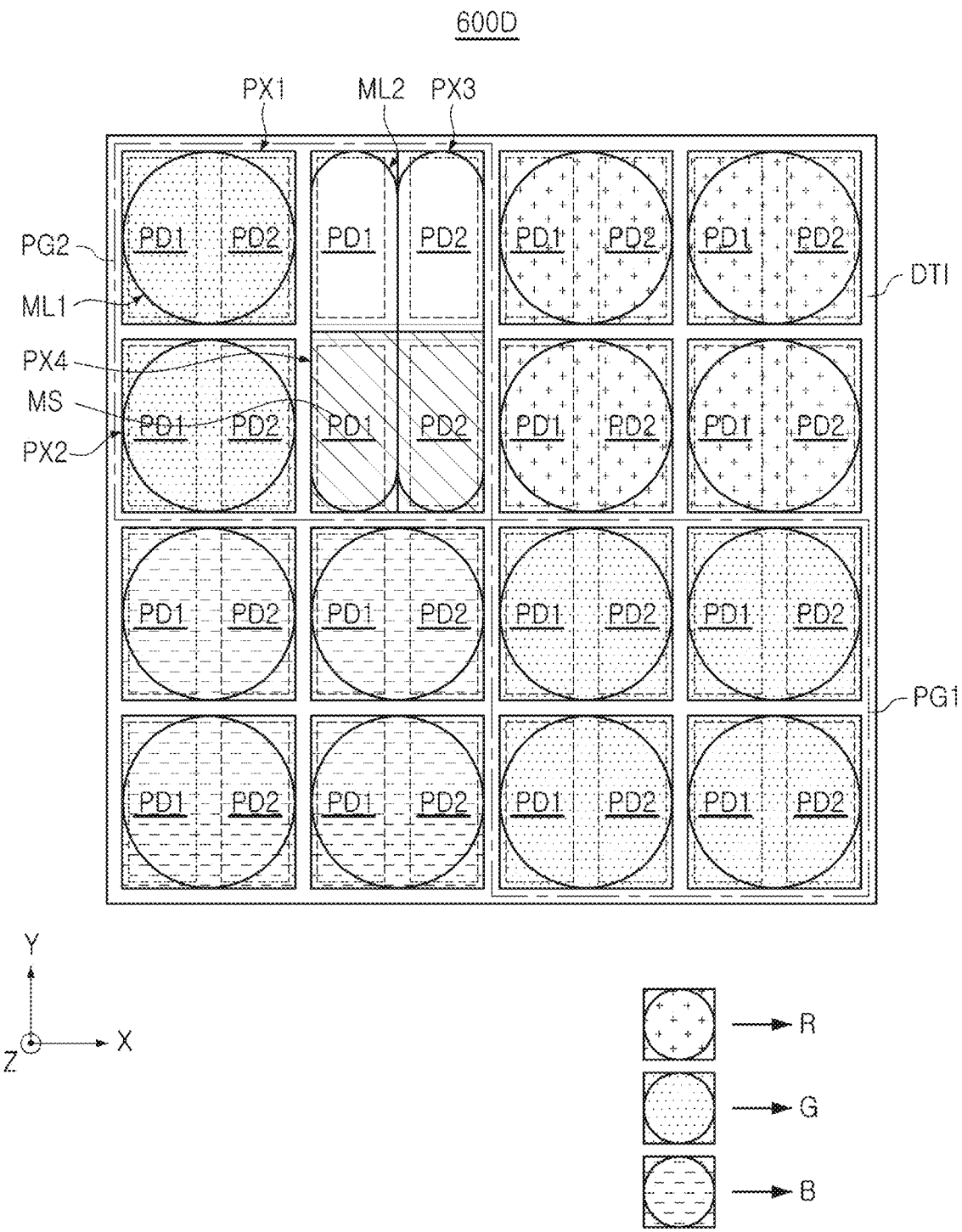

Also, referring to FIGS. 29 and 30, two unit pixels disposed side-by-side in the third direction may share the two second microlenses ML2. For example, the first pixel PX1 and the second pixel PX2, or the third pixel PX3 and the fourth pixel PX4 may share two second microlenses ML2. Accordingly, each of the second microlenses ML2 may have a length smaller than the length of the unit pixel in the second direction. Meanwhile, the first pixel PX1 of the second pixel group PG2 included in the image sensor 600C of FIG. 29 may include a light shielding film MS, and the first pixel PX1 may be defined as first shielding pixel according to a position of a light shielding film MS. The fourth pixel PX1 of the second pixel group PG2 included in the image sensor 600D of FIG. 30 may include a light shielding film MS, and the fourth pixel PX1 may be defined as a second shielding pixel according to a position of the light shielding film MS.

Figure 31:
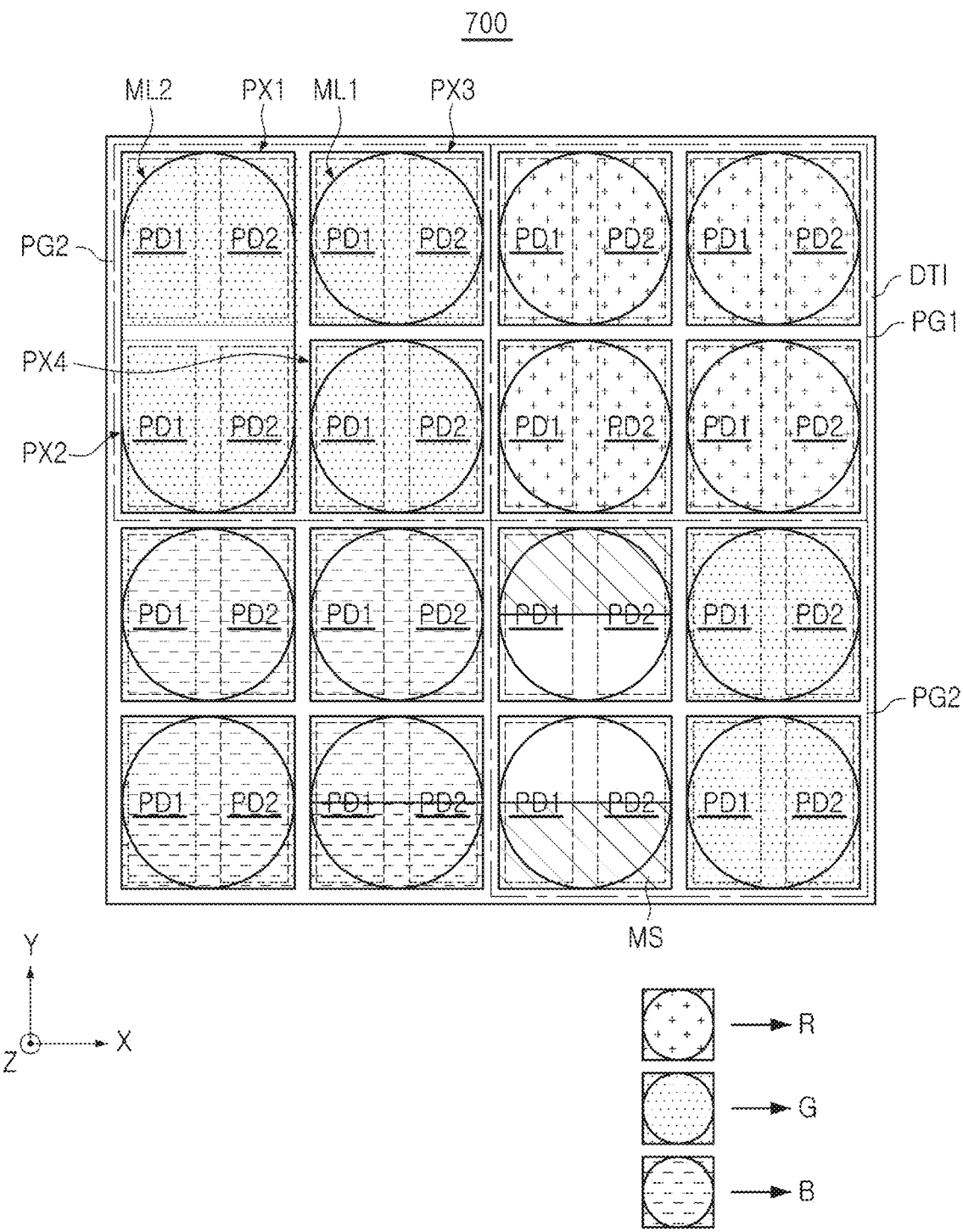
FIG. 31 is a top view of an image sensor according to some example embodiments.

Referring to FIG. 31, the shielding pixel including the light shielding film MS may not correspond to the second microlens ML2. As an example, unit pixels having one tetra color filter arrangement may include two second pixel groups PG2, and each of the second pixel groups PG2 may include a light shielding film MS or a second microlens ML2. However, the position and arrangement of the light shielding film MS and the second microlens ML2 the present example embodiments are not limited thereto as illustrated in FIG. 31.

Meanwhile, the arrangement and number of the light shielding films MS may vary according to example embodiments. The number of first shielding pixels included in each of the image sensors 600A, 600B, 600C, 600D, and 700 may be the same as the number of second shielding pixels.

Figure 32:
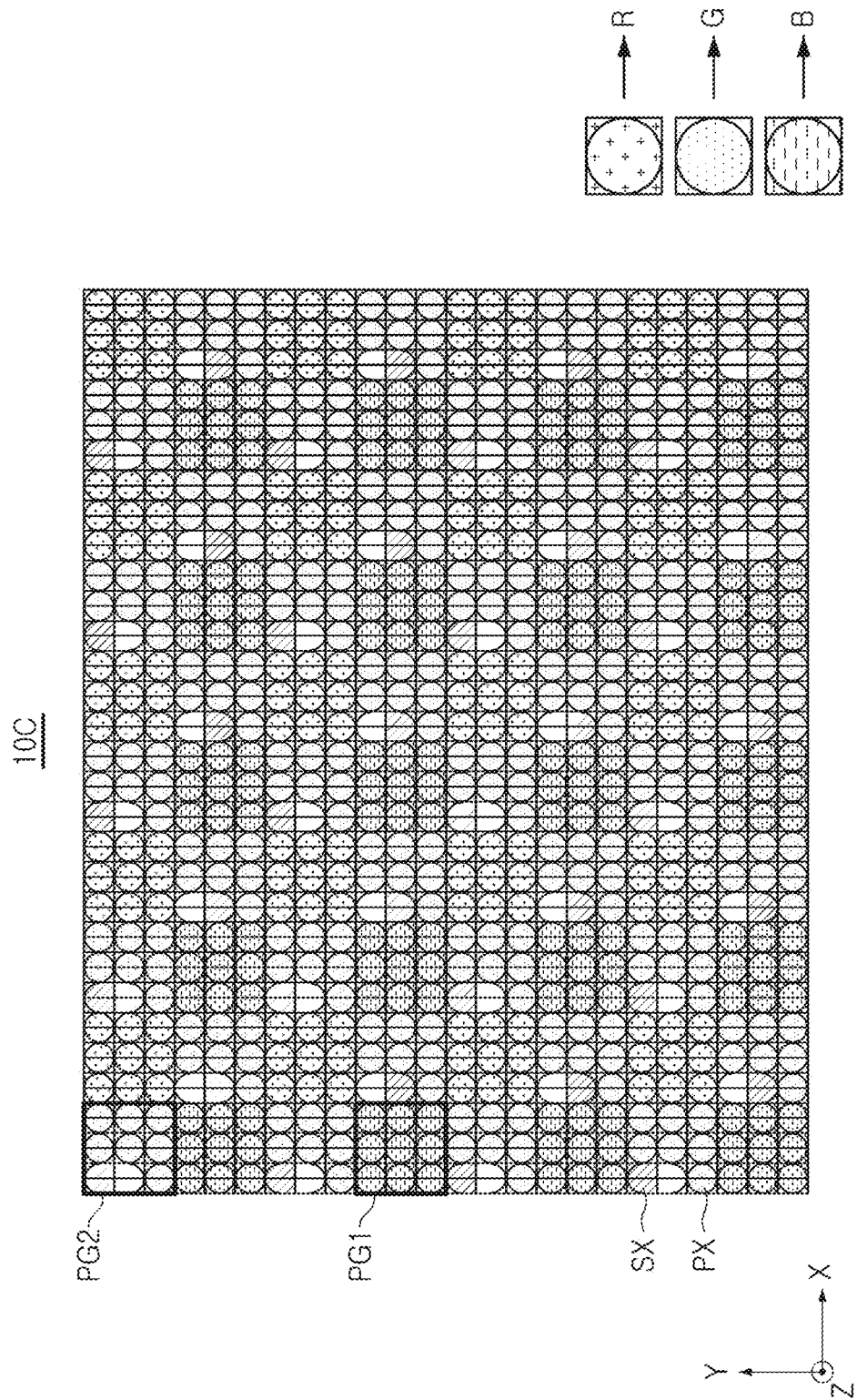
FIG. 32 is a diagram illustrating a pixel array included in an image sensor according to some example embodiments.

FIG. 32 is a diagram illustrating a pixel array included in an image sensor according to some example embodiments.

Next, referring to FIG. 32, the pixel array 10C may include a plurality of pixel groups PG1 and PG2, similar to the pixel array 10B illustrated in FIG. 16, and each of the pixel groups PG1 and PG2 may include a plurality of unit pixels PX. The pixels PX included in each of the pixel groups PG1 and PG2 may include color filters of the same color. However, unlike the pixel array 10B illustrated in FIG. 16, each of the plurality of pixel groups PG1 and PG2 included in the pixel array 10C may include 3×3 pixels PX. In detail, the pixel array 10C of the image sensor according to some example embodiments may include a color filter having an arrangement to generate an image having a Nona pattern. As an example, the pixel array 10C of the image sensor may have a 6×6 furnace or color filter array in which red, green, green, and blue are each arranged in a 3×3 form. However, this is only an example of the example embodiments, and an arrangement of repetitively configured color filters may vary.

The image sensor according to some example embodiments provides improved autofocusing performance in the vertical direction of the image sensor by a second microlens and a light shielding film included in at least one of the unit pixels PX of the pixel array 10C. For example, the unit pixel PX including the light shielding film may be defined as a shielding pixel SPX. Meanwhile, the plurality of pixel groups PG1 and PG2 may include a first pixel group PG1 not including the shielding pixel SPX and a second pixel group PG2 including the shielding pixel SPX. However, this is only an example of the example embodiments and the example embodiments are not limited, and when the image sensor does not include the shielding pixel SPX, the second pixel group PG2 may be defined as a pixel group including pixels including a modified second microlens to supplement the autofocusing performance in the vertical direction.

The unit pixels PX included in the pixel array 10C illustrated in FIG. 32 may be arranged to have various arrangements. Accordingly, it is possible to improve or maximize the autofocusing performance of the image sensor.

Figure 33:
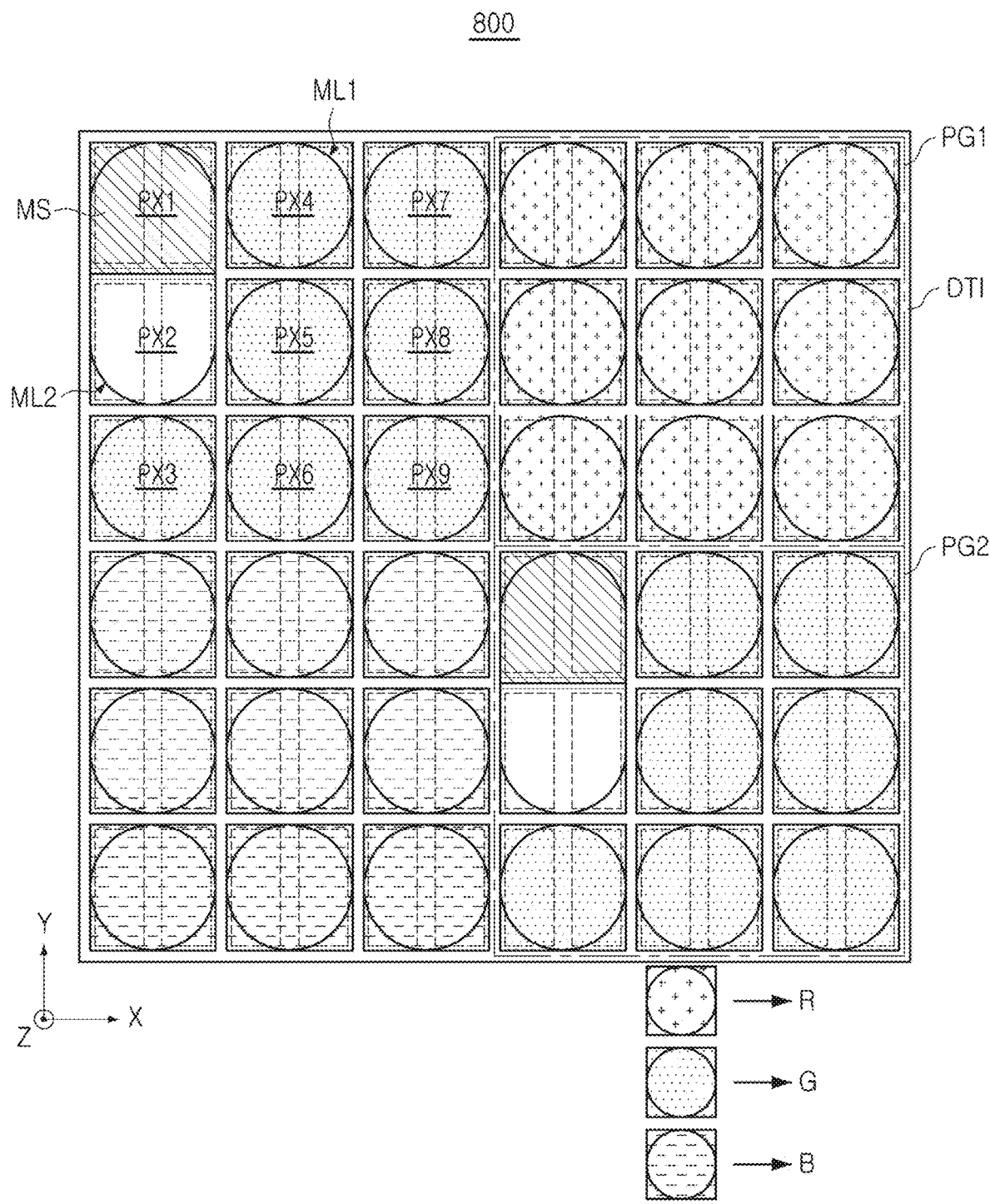
FIG. 33 is a top view of an image sensor according to some example embodiments.

FIG. 33 is a top view of an image sensor according to some example embodiments.

Referring to FIG. 33, the image sensor 800 according to example embodiments may be an image sensor including a color filter having a furnace color filter arrangement. As an example, the image sensor 800 may include first and second photodiodes PD1 and PD2 separated in a second direction (e.g., x direction) inside a semiconductor substrate, a device isolation film DTI disposed between a plurality of the unit pixels PX1, PX2, PX3, and PX4, a first microlens ML1, a second microlens ML2 modified from the first microlens ML1, and a light shielding film MS. However, this is only an example and the present example embodiments are not limited thereto. For example, the image sensor 800 may not include the light shielding film MS or may not include the second microlens ML2. Alternatively or additionally, the image sensor 800 illustrated in FIG. 33 shares the second microlens ML2 in the first pixel PX1 and the second pixel PX2, and the first pixel PX1 is illustrated as a shielding pixel. However, the present example embodiments are not limited thereto.

Figure 34:
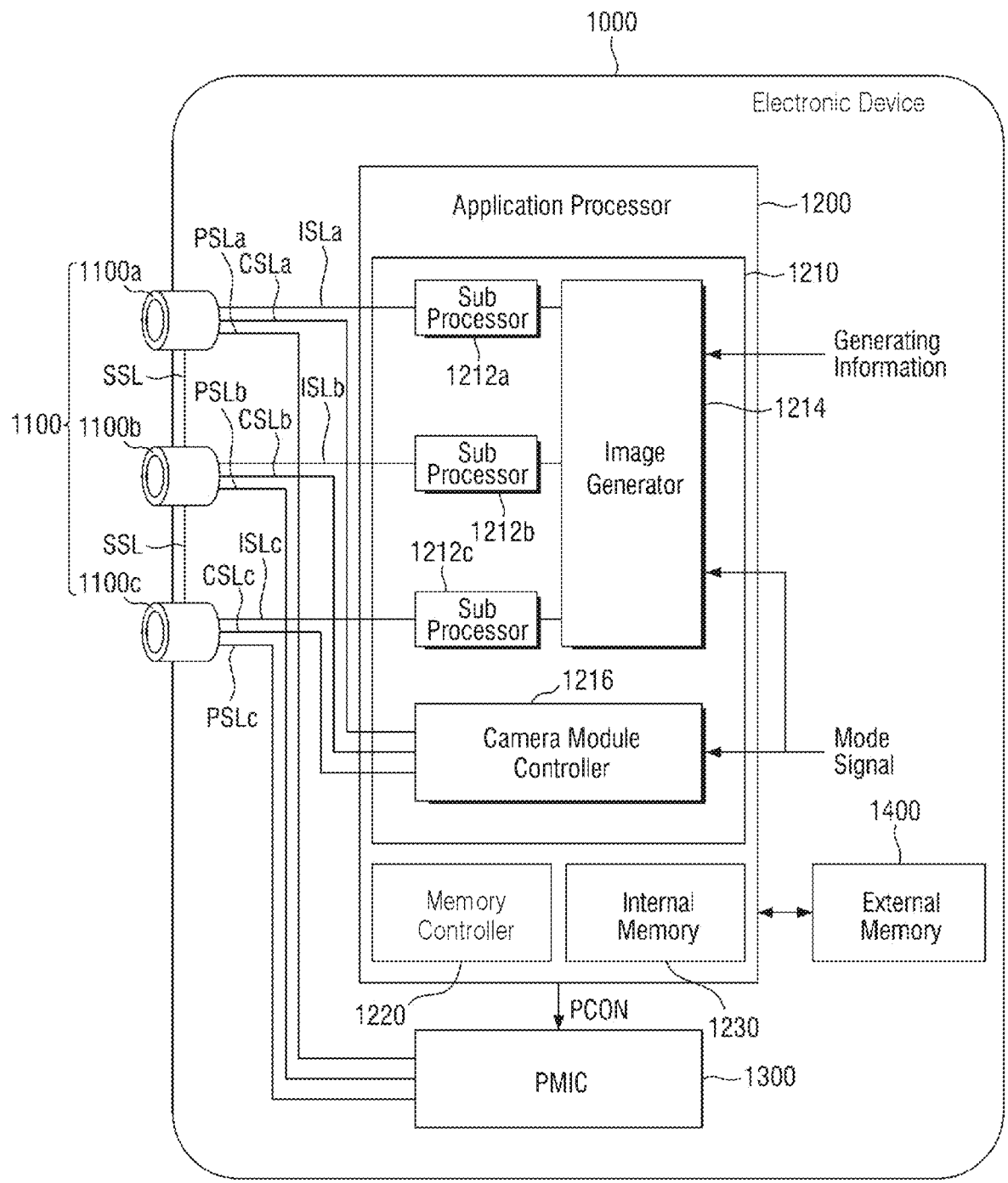
FIGS. 34 and 35 are diagrams schematically illustrating an electronic device including an image sensor according to some example embodiments.
Figure 35:
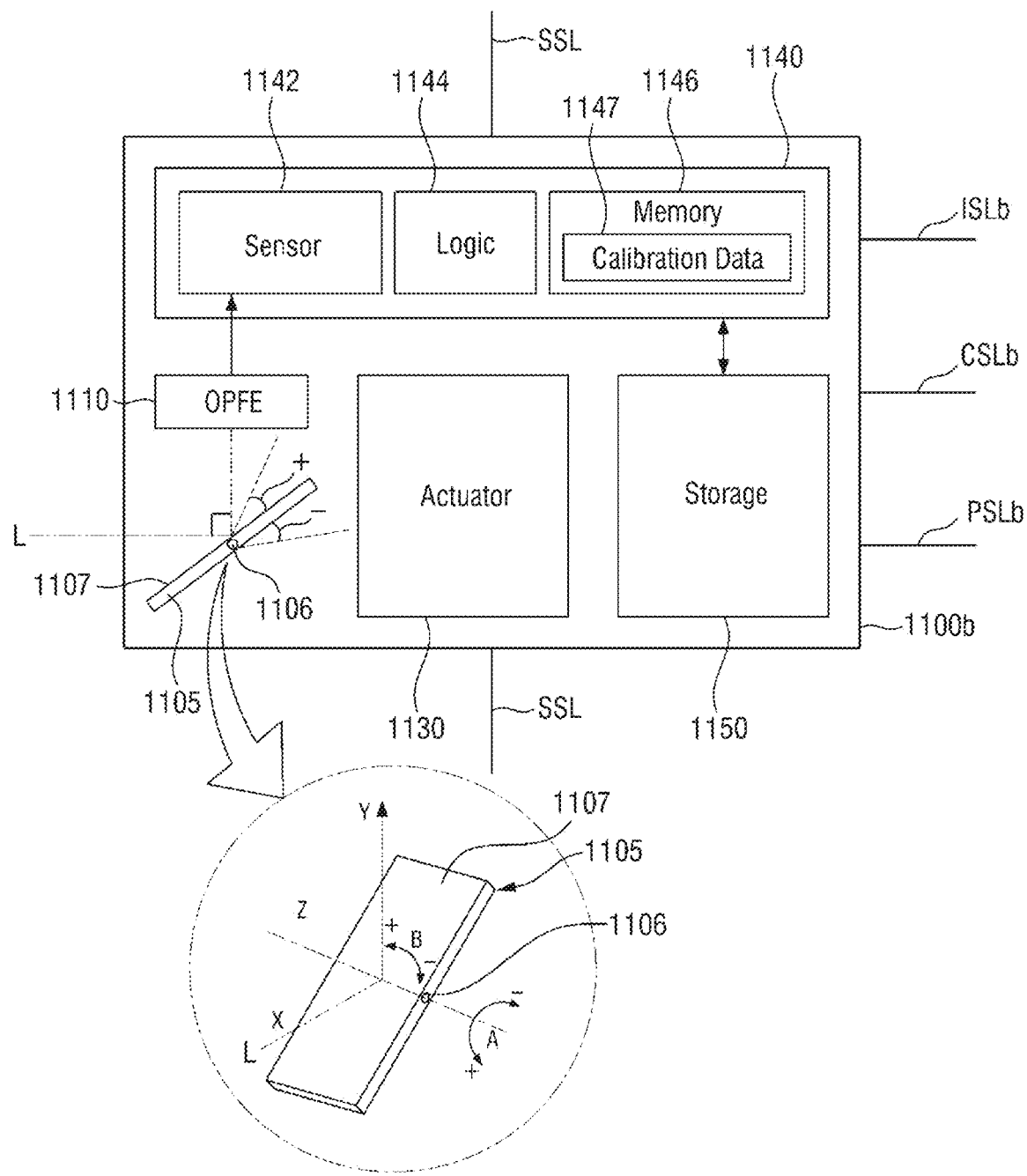

FIGS. 34 and 35 are diagrams schematically illustrating an electronic device including an image sensor according to some example embodiments.

Referring to FIG. 34, the electronic device 1000 may include a camera module group 1100, an application processor 1200, a PMIC 1300, and an external memory 1400.

The camera module group 1100 may include a plurality of camera modules 1100a, 1100b, and 1100c. Although the drawing shows some example embodiments in which three camera modules 1100a, 1100b, and 1100c are arranged, the example embodiments are not limited thereto. In some example embodiments, the camera module group 1100 may be modified to include only two camera modules. Alternatively or additionally, in some example embodiments, the camera module group 1100 may be modified and implemented to include n (where n is a natural number of 4 or more) camera modules. Alternatively or additionally, in some example embodiments, at least one of the plurality of camera modules 1100a, 1100b, and 1100c included in the camera module group 1100 may include an image sensor according to one of the example embodiments described with reference to the figures.

Hereinafter, a detailed configuration of the camera module 1100b will be described in more detail with reference to FIG. 35, but the following description may be equally applied to other camera modules 1100a and 1100b according to some example embodiments.

Referring to FIG. 35, the camera module 1100b may include a prism 1105, an optical path folding element (hereinafter referred to as "OPFE") 1110, an actuator 1130, an image sensing device 1140, and a storage device 1150.

The prism 1105 may change the path of the light L incident from the outside including the reflective surface 1107 of the light reflecting material.

In some example embodiments, the prism 1105 may change the path of the light L incident in the first direction X in the second direction Y perpendicular to the first direction X. Alternatively or additionally, the prism 1105 rotates the reflective surface 1107 of the light reflective material in the direction A around the central axis 1106, or rotates the central axis 1106 in the direction B to move the reflective surface 1107 in the first direction X. The path of the incident light L may be changed in the vertical second direction Y. In this case, the OPFE 1110 may also move in a third direction Z perpendicular to the first direction X and the second direction Y.

In some example embodiments, as illustrated, the maximum rotation angle of the prism 1105 in the A direction is less than 15 degrees in the positive (+) A direction, and may be greater than 15 degrees in the negative (−) A direction. However, embodiments are not limited thereto.

In some example embodiments, the prism 1105 may move between 20 degrees in the plus (+) or minus (−) B direction, or between 10 degrees and 20 degrees, or between 15 degrees and 20 degrees, where the angle of movement is positive. It may move at the same angle in the (+) or minus (−) B direction, or it may move to almost the same angle in the range of around 1 degree.

In some example embodiments, the prism 1105 may move the reflective surface 1106 of the light reflecting material in a third direction (e.g., the Z direction) parallel to the extending direction of the central axis 1106.

The OPFE 1110 may include, for example, an optical lens consisting of m (where m is a natural number) groups. The m lenses may move in the second direction Y to change the optical zoom ratio of the camera module 1100b. For example, when the basic optical zoom magnification of the camera module 1100b is Z, when moving m optical lenses included in the OPFE 1110, the optical zoom magnification of the camera module 1100b is 3Z or 5Z, or may be changed to an optical zoom magnification of 5Z or higher.

The actuator 1130 may move the OPFE 1110 or an optical lens (hereinafter, referred to as an optical lens) to a specific position. For example, the actuator 1130 may adjust the position of the optical lens so that the image sensor 1142 is positioned at a focal length of the optical lens for accurate sensing.

The image sensing device 1140 may include an image sensor 1142, a control logic 1144, and a memory 1146. The image sensor 1142 may sense an image of a sensing target using light L provided through an optical lens. The control logic 1144 may control the overall operation of the camera module 1100b. For example, the control logic 1144 may control the operation of the camera module 1100b according to a control signal provided through the control signal line CSLb.

The memory 1146 may store information necessary for the operation of the camera module 1100b such as calibration data 1147. The calibration data 1147 may include information necessary for the camera module 1100b to generate image data using light L provided from the outside. The calibration data 1147 may include, for example, information on a degree of rotation described above, information on a focal length, information on an optical axis, and the like. When the camera module 1100b is implemented in the form of a multi-state camera whose focal length is changed according to the position of the optical lens, the calibration data 1147 may include the focal length values for each position (or state) of the optical lens and information related to autofocusing.

The storage unit 1150 may store image data sensed through the image sensor 1142. The storage unit 1150 may be disposed outside of the image sensing device 1140 and may be implemented in a stacked form with a sensor chip constituting the image sensing device 1140. In some example embodiments, the storage unit 1150 may be implemented as an Electrically Erasable Programmable Read-Only Memory (EEPROM), but example embodiments are not limited thereto.

Referring to FIGS. 34 and 35 together, in some example embodiments, each of the plurality of camera modules 1100a, 1100b, and 1100c may include an actuator 1130. Accordingly, each of the plurality of camera modules 1100a, 1100b, and 1100c may include the same or different calibration data 1147 according to the operation of the actuator 1130 included therein.

In some example embodiments, one camera module (e.g., 1100b) among the plurality of camera modules 1100a, 1100b and 1100c may be a folded lens-type camera module including the prism 1105 and OPFE 1110 described above, and the remaining camera modules (e.g., 1100a and 1100b) may be vertical type camera modules that do not include the prism 1105 and the OPFE 1110, but example embodiments are limited thereto.

In some example embodiments, one camera module (e.g., 1100c) among a plurality of camera modules 1100a, 1100b and 1100c is a vertical for extracting depth information using, for example, Infrared Rays (IR), and may be a type of depth camera. In this case, the application processor 1200 merges the image data provided from the depth camera and the image data provided from another camera module (for example, 1100a or 1100b) to generate a 3D depth image.

In some example embodiments, at least two camera modules (e.g., 1100a and 1100b) among the plurality of camera modules 1100a, 1100b, and 1100c may have different fields of view (view fields). In this case, for example, the optical lenses of at least two camera modules (e.g., 1100a, 1100b) among the plurality of camera modules 1100a, 1100b, and 1100c may be different from each other, but are not limited thereto.

Alternatively or additionally, in some example embodiments, viewing angles of each of the plurality of camera modules 1100a, 1100b, and 1100c may be different from each other. In this case, the optical lenses included in each of the plurality of camera modules 1100a, 1100b, and 1100c may also be different from each other, but the present disclosure is not limited thereto.

In some example embodiments, each of the plurality of camera modules 1100a, 1100b, and 1100c may be physically separated from each other and disposed. For example, the sensing area of one image sensor 1142 is not divided and used by the plurality of camera modules 1100a, 1100b, and 1100c, but an independent image sensor 1142 may be disposed inside of the plurality of respective camera modules 1100a, 1100b, and 1100c.

Referring back to FIG. 34, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented by being separated from each other as separate semiconductor chips.

The image processing apparatus 1210 may include a plurality of sub-image processors 1212a, 1212b, and 1212c, an image generator 1214, and a camera module controller 1216.

The image processing apparatus 1210 may include a plurality of sub-image processors 1212a, 1212b, and 1212c corresponding to the number of the plurality of camera modules 1100a, 1100b, and 1100c.

Image data generated from each of the camera modules 1100a, 1100b, and 1100c may be provided to the corresponding sub-image processors 1212a, 1212b, and 1212c through image signal lines ISLa, ISLb, and ISLc separated from each other. For example, image data generated from the camera module 1100a is provided to the sub-image processor 1212a through an image signal line ISLa, and the image data generated from the camera module 1100b is an image signal line ISLb. The image data is provided to the sub-image processor 1212b and generated from the camera module 1100c may be provided to the sub-image processor 1212c through the image signal line ISLc. Such image data transmission may be performed using, for example, a camera serial interface (CSI) based on a Mobile Industry Processor Interface (MIPI), but example embodiments are not limited thereto.

Meanwhile, in some example embodiments, one sub-image processor may be arranged to correspond to a plurality of camera modules. For example, the sub image processor 1212a and the sub image processor 1212c are not implemented separately from each other as illustrated, but are implemented by being integrated into one sub image processor, and the camera module 1100a and the camera module 1100c The image data provided from may be selected through a selection element (e.g., a multiplexer) or the like, and then provided to an integrated sub-image processor.

Image data provided to each of the sub-image processors 1212a, 1212b, and 1212c may be provided to the image generator 1214. The image generator 1214 may generate an output image using image data provided from each of the sub-image processors 1212a, 1212b, and 1212c according to the image generating information or the mode signal.

Specifically, the image generator 1214 merges at least some of the image data generated from the camera modules 1100a, 1100b, and 1100c having different viewing angles according to the image generation information or the mode signal to generate an output image. Alternatively or additionally, the image generator 1214 may generate an output image by selecting any one of image data generated from camera modules 1100a, 1100b, and 1100c having different viewing angles according to image generation information or a mode signal.

In some example embodiments, the image generation information may include a zoom signal or zoom factor. Further, in some example embodiments, the mode signal may be, for example, a signal based on a mode selected from a user.

When the image generation information is a zoom signal (zoom factor), and each camera module 1100a, 1100b, 1100c has a different viewing field (viewing angle), the image generator 1214 operates differently according to the type of the zoom signal. For example, when the zoom signal is the first signal, after merging the image data output from the camera module 1100a and the image data output from the camera module 1100c, the merged image signal and the camera module not used for merging an output image may be generated by using the image data output from (1100b). If the zoom signal is a second signal different from the first signal, the image generator 1214 does not perform such image data merging, and converts any one of the image data output from each camera module 1100a, 1100b, 1100c, to create an output image. However, embodiments are not limited thereto, and a method of processing image data may be modified and implemented as needed.

In some example embodiments, the image generator 1214 receives a plurality of image data having different exposure times from at least one of the plurality of sub-image processors 1212a, 1212b, and 1212c, and high dynamic range (HDR) for the plurality of image data, and thus, it is possible to generate merged image data with an increased dynamic range.

The camera module controller 1216 may provide a control signal to each of the camera modules 1100a, 1100b, and 1100c. The control signal generated from the camera module controller 1216 may be provided to the corresponding camera modules 1100a, 1100b, and 1100c through control signal lines CSLa, CSLb, and CSLc separated from each other.

Any one of the plurality of camera modules 1100a, 1100b, 1100c is designated as a master camera (e.g., 1100b) according to image generation information including a zoom signal or a mode signal, and the remaining camera modules (e.g., 1100a and 1100c). For example, 1100a and 1100c may be designated as slave cameras. Such information may be included in the control signal and provided to the corresponding camera modules 1100a, 1100b, and 1100c through control signal lines CSLa, CSLb, and CSLc separated from each other.

Camera modules operating as masters and slaves may be changed according to a zoom factor or an operation mode signal. For example, when the viewing angle of the camera module 1100a is wider than that of the camera module 1100b and the zoom factor shows a low zoom magnification, the camera module 1100b operates as a master, and the camera module 1100a is a slave. Conversely, when the zoom factor indicates a high zoom magnification, the camera module 1100a may operate as a master and the camera module 1100b may operate as a slave.

In some example embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving such a sync enable signal generates a sync signal based on the provided sync enable signal, and transmits the generated sync signal to the camera modules 1100a and 1100c may be provided. The camera module 1100b and the camera modules 1100a and 1100c may be synchronized with the sync signal to transmit image data to the application processor 1200.

In some example embodiments, a control signal provided from the camera module controller 1216 to the plurality of camera modules 1100a, 1100b, and 1100c may include mode information according to the mode signal. Based on this mode information, the plurality of camera modules 1100a, 1100b, and 1100c may operate in a first operation mode and a second operation mode in relation to the sensing speed.

The plurality of camera modules 1100a, 1100b, and 1100c generate an image signal at a first rate (e.g., generate an image signal at a first frame rate) in a first operation mode, and generate a second image signal higher than the first rate. Encoding at a rate (e.g., encoding an image signal having a second frame rate higher than the first frame rate), and transmitting the encoded image signal to the application processor 1200. In this case, the second speed may be 30 times or less of the first speed.

The application processor 1200 stores the received image signal, for example, the encoded image signal, in the memory 1230 provided therein or the storage 1400 outside of the application processor 1200, and then, the memory 1230 or the storage The image signal encoded from the 1400 may be read and decoded, and image data generated based on the decoded image signal may be displayed. For example, a corresponding subprocessor among the plurality of subprocessors 1212a, 1212b, and 1212c of the image processing apparatus 1210 may perform decoding, and may also perform image processing on the decoded image signal.

The plurality of camera modules 1100a, 1100b, and 1100c generate an image signal at a third rate lower than the first rate in the second operation mode (e.g., an image signal having a third frame rate lower than the first frame rate) and transmits the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to each of the plurality of camera modules 1100a, 1100b, and 1100c. For example, the PMIC 1300 supplies first power to the camera module 1100a through the power signal line PSLa under the control of the application processor 1200, and the camera module (the second power may be supplied to 1100b), and the third power may be supplied to the camera module 1100c through the power signal line PSLc.

The PMIC 1300 may generate power corresponding to each of the plurality of camera modules 1100a, 1100b, and 1100c in response to the power control signal PCON from the application processor 1200, and may also adjust the power level. The power control signal PCON may include a power adjustment signal for each operation mode of the plurality of camera modules 1100a, 1100b, and 1100c. For example, the operation mode may include a low power mode, and in this case, the power control signal PCON may include information on a camera module operating in a low power mode and a set power level. Levels of power signals provided to each of the plurality of camera modules 1100a, 1100b, and 1100c may be the same or different from each other. Also, the level of power signals may be dynamically changed.

As set forth above, an image sensor according to some example embodiments may include a microlens shared by vertically adjacent unit pixels and a light shielding film overlapping a portion of the microlens, and thus, a phase difference of light incident in a vertical direction may be used. Accordingly, the autofocusing function not only in the horizontal direction but also in the vertical direction may be supplemented.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The electronic device 1000 (or other circuitry, for example, the application processor 1200, image generator 1214, camera module controller 1216, memory controller 1220, PMIC 1300, camera 1100a (1100b, 1100c, etc.), or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of the present inventive concepts as defined by the appended claims.

What is claimed is:

1. An image sensor comprising:
    a first unit pixel comprising two photodiodes, a blue color filter, and a microlens on the two photodiodes;
    a second unit pixel comprising two photodiodes, a green color filter, and a microlens on the two photodiodes;
    a third unit pixel comprising two photodiodes, a red color filter, a microlens on the two photodiodes;
    a fourth unit pixel comprising two photodiodes, a microlens on the two photodiodes, and a first light shielding film; and
    a fifth unit pixel comprising two photodiodes, a microlens on the two photodiodes, and a second light shielding film;
    wherein the two photodiodes in each of the fourth unit pixel and the fifth unit pixel are separated from each other in a first direction in a plan view,
    wherein a half portion of each of the fourth unit pixel and the fifth unit pixel is blocked by the first light shielding film and the second light shielding film respectively in the plan view,
    wherein N unit pixels are disposed between the fourth unit pixel and the fifth unit pixel in a second direction in the plan view,
    wherein N is an integer greater than 2,
    wherein the second direction is perpendicular to the first direction in the plan view, and
    wherein the fourth unit pixel and the fifth unit pixel are sequentially arranged in the second direction.

2. The image sensor of claim 1, wherein the first to fourth unit pixels are arranged in a clockwise direction.

3. The image sensor of claim 2, wherein the fourth unit pixel further comprises a green color filter.

4. The image sensor of claim 3, wherein the half portion is an upward position with respect to a line passing through a center of each of the fourth unit pixel and the fifth unit pixel in the second direction in the plan view.

5. The image sensor of claim 4, wherein N is greater than 4.

6. The image sensor of claim 5, further comprising:
    a sixth unit pixel comprising two photodiodes, a microlens on the two photodiodes, and a third light shielding film,
    wherein a half portion of the sixth unit pixel is blocked by the third light shielding film in the plan view, wherein M unit pixels are disposed between the fourth unit pixel and the sixth unit pixel in the first direction in the plan view, wherein M is an integer greater than 2, and wherein M is different from N.

7. The image sensor of claim 6, wherein M is greater than N.

8. The image sensor of claim 4, further comprising:
a seventh unit pixel comprising two photodiodes, a microlens on the two photodiodes, and a fourth light shielding film, wherein a half portion of the seventh unit pixel is blocked by the fourth light shielding film in the plan view, and wherein the half portion is a downward position with respect to a line passing through a center of the seventh unit pixel in the second direction in the plan view.

9. The image sensor of claim 3, wherein the half portion is a downward position with respect to a line passing through a center of each of the fourth to fifth unit pixels in the second direction in the plan view.

10. An image sensor comprising:
a plurality of first pixel groups each comprising:
a first unit pixel comprising two photodiodes, a blue color filter, and a microlens on the two photodiodes;
a second unit pixel comprising two photodiodes, a green color filter, and a microlens on the two photodiodes;
a third unit pixel comprising two photodiodes, a red color filter, and a microlens on the two photodiodes; and
a fourth unit pixel comprising two photodiodes, a green color filter, and a microlens on the two photodiodes,
wherein the two photodiodes in each of the first to fourth unit pixels are separated from each other in a first direction in a plan view,
wherein a half portion of the fourth unit pixel is blocked by a first light shielding film in the plan view,
wherein the first to fourth unit pixels are arranged in two consecutive rows and two consecutive columns and arranged in a clockwise direction,
wherein N unit pixels are disposed between the fourth unit pixel of the plurality of first pixel groups in a second direction,
wherein N is an integer greater than 2, and
wherein the second direction is perpendicular to the first direction in the plan view.

11. The image sensor of claim 10, wherein N is greater than 4.

12. The image sensor of claim 11, wherein the half portion is an upward position with respect to a line passing through a center of the fourth unit pixel in the second direction in the plan view.

13. The image sensor of claim 12, further comprising:
a plurality of second pixel groups each comprising:
a fifth unit pixel comprising two photodiodes, a blue color filter, and a microlens on the two photodiodes;
a sixth unit pixel comprising two photodiodes, a green color filter, and a microlens on the two photodiodes;
a seventh unit pixel comprising two photodiodes, a red color filter, and a microlens on the two photodiodes; and
an eighth unit pixel comprising two photodiodes separated from each other in the first direction in the plan view, a green color filter, and a microlens on the two photodiodes, wherein the fifth to eighth unit pixel are arranged in two consecutive rows and two consecutive columns, wherein a half portion of the eighth unit pixel is blocked by a second light shielding film in the plan view, and wherein the half portion of the eighth unit pixel is a downward position with respect to the line passing through the center of the eighth unit pixel in the second direction in the plan view.

14. The image sensor of claim 11, wherein the half portion is a downward position with respect to a line passing through a center of the fourth unit pixel in the second direction in the plan view.

15. An image sensor comprising:
a first unit pixel comprising two photodiodes, a blue color filter, and a microlens on the two photodiodes;
a second unit pixel comprising two photodiodes, a green color filter, and a microlens on the two photodiodes;
a third unit pixel comprising two photodiodes, a red color filter, a microlens on the two photodiodes;
a fourth unit pixel comprising two photodiodes, a microlens on the two photodiodes, and a first light shielding film;
a fifth unit pixel comprising two photodiodes, a microlens on the two photodiodes, and a second light shielding film; and
a sixth unit pixel comprising two photodiodes, a microlens on the two photodiodes, and a third light shielding film,
wherein the two photodiodes in each of the first to sixth unit pixels are separated from each other in a first direction in a plan view,
wherein a half portion of each of the fourth to sixth unit pixels is blocked by the first to third light shielding films respectively in the plan view,
wherein N unit pixels are disposed between the fourth unit pixel and the fifth unit pixel in a second direction in the plan view,
wherein M unit pixels are disposed between the fourth unit pixel and the sixth unit pixel in the first direction in the plan view,
wherein N and M are integers greater than 2, and
wherein the second direction is perpendicular to the first direction in the plan view.

16. The image sensor of claim 15, wherein N is different from M.

17. The image sensor of claim 15, wherein the first to fourth unit pixels are arranged in a clockwise direction, and
wherein the first to fourth unit pixels are arranged in two consecutive rows and two consecutive columns.

18. The image sensor of claim 17, wherein the half portion of the fifth unit pixel is an upward position with respect to a line passing through a center of the fifth unit pixel in the second direction in the plan view.

19. The image sensor of claim 18, wherein the half portion of the sixth unit pixel is an upward position with respect to a line passing through a center of the sixth unit pixel in the second direction in the plan view.

20. The image sensor of claim 17, wherein the half portion of the fifth unit pixel is a downward position with respect to a line passing through a center of the fifth unit pixel in the second direction in the plan view.

* * * * *